(12) United States Patent
Huang

(10) Patent No.: US 12,363,986 B2
(45) Date of Patent: *Jul. 15, 2025

(54) SEMICONDUCTOR DEVICE WITH CONTACT STRUCTURE AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 473 days.

This patent is subject to a terminal disclaimer.

(21) Appl. No.: 17/953,046

(22) Filed: Sep. 26, 2022

(65) Prior Publication Data

US 2024/0113196 A1    Apr. 4, 2024

(51) Int. Cl.
*H01L 29/45* (2006.01)
*H10D 64/01* (2025.01)
*H10D 64/62* (2025.01)

(52) U.S. Cl.
CPC ............ *H10D 64/62* (2025.01); *H10D 64/01* (2025.01)

(58) Field of Classification Search
None
See application file for complete search history.

(56) References Cited

U.S. PATENT DOCUMENTS

| | | | |
|---|---|---|---|
| 2014/0035143 A1* | 2/2014 | Lee | H01L 23/50 438/653 |
| 2021/0287994 A1* | 9/2021 | Hsueh | H01L 21/76846 |
| 2022/0122991 A1* | 4/2022 | Chen | H10B 12/485 |
| 2022/0199773 A1 | 6/2022 | Rachmady et al. | |
| 2022/0271032 A1 | 8/2022 | Yang et al. | |
| 2023/0328970 A1* | 10/2023 | Lai | H10D 64/666 257/213 |

FOREIGN PATENT DOCUMENTS

| | | |
|---|---|---|
| TW | 201314928 A | 4/2013 |
| TW | 201332173 A | 8/2013 |

* cited by examiner

*Primary Examiner* — William C Trapanese
(74) *Attorney, Agent, or Firm* — MUNCY, GEISSLER, OLDS & LOWE, P.C.

(57) ABSTRACT

The present application discloses a contact structure, a semiconductor device, and a method for fabricating the semiconductor device. The semiconductor device includes a substrate; an impurity region positioned in the substrate; an intervening conductive layer positioned on the impurity region; a bottom conductive layer positioned on the bottom conductive layer; a conductive capping layer positioned on the bottom conductive layer; a top conductive layer positioned on the conductive capping layer. The intervening conductive layer, the bottom conductive layer, the conductive capping layer, and the top conductive layer configure a contact structure. The bottom conductive layer includes germanium or silicon germanium. The bottom conductive layer includes n-type dopants or p-type dopants.

19 Claims, 24 Drawing Sheets

SEMICONDUCTOR DEVICE WITH CONTACT STRUCTURE AND METHOD FOR FABRICATING THE SAME

TECHNICAL FIELD

The present disclosure relates to a semiconductor device and a method for fabricating the semiconductor device, and more particularly, to a semiconductor device with a contact structure and a method for fabricating the semiconductor device with the contact structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a contact structure including an intervening conductive layer; a bottom conductive layer positioned on the intervening conductive layer; a conductive capping layer positioned on the bottom conductive layer; and a top conductive layer positioned on the conductive capping layer.

The bottom conductive layer includes germanium or silicon germanium. The bottom conductive layer includes n-type dopants or p-type dopants.

Another aspect of the present disclosure provides a semiconductor device including a substrate; an impurity region positioned in the substrate; an intervening conductive layer positioned on the impurity region; a bottom conductive layer positioned on the bottom conductive layer; a conductive capping layer positioned on the bottom conductive layer; a top conductive layer positioned on the conductive capping layer. The intervening conductive layer, the bottom conductive layer, the conductive capping layer, and the top conductive layer configure a contact structure. The bottom conductive layer includes germanium or silicon germanium. The bottom conductive layer includes n-type dopants or p-type dopants.

Another aspect of the present disclosure provides a method for fabricating a semiconductor device including providing a substrate; forming an impurity region in the substrate; forming a bottom conductive layer on the impurity region; performing an implantation process using p-type dopants or n-type dopants to the bottom conductive layer; performing an annealing process to form an intervening conductive layer between the impurity region and the bottom conductive layer; forming a conductive capping layer on the bottom conductive layer; and forming a top conductive layer on the conductive capping layer. The intervening conductive layer, the bottom conductive layer, the conductive capping layer, and the top conductive layer configure a contact structure. The bottom conductive layer includes germanium or silicon germanium.

Due to the design of the semiconductor device of the present disclosure, the resistance of the contact structure may be reduced by employing the bottom conductive layer formed of germanium. As a result, the performance of the semiconductor device including the contact structure may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
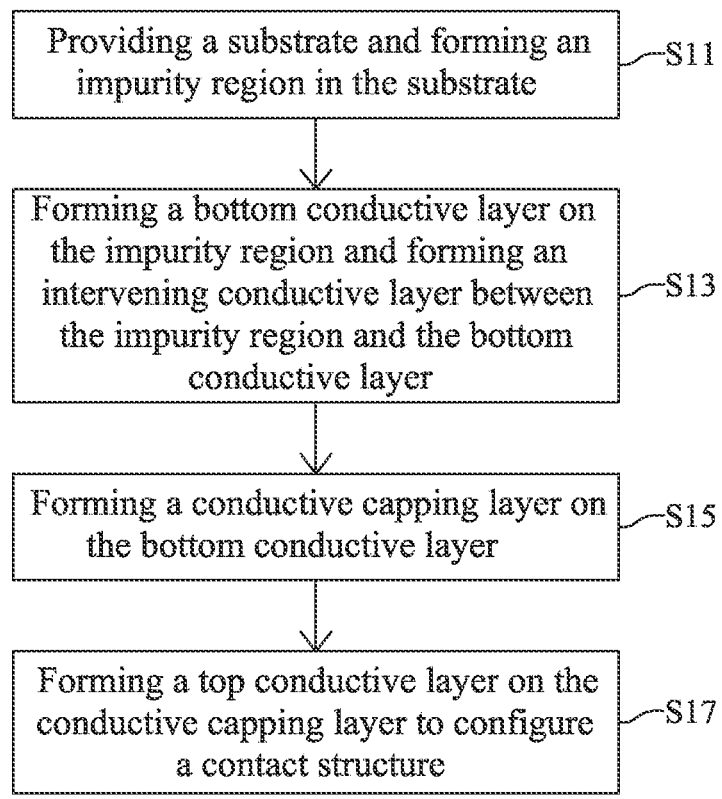
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1A in accordance with one embodiment of the present disclosure. FIGS. 2 to 12 illustrate, in schematic cross-sectional view diagrams, a flow for fabricating the semiconductor device 1A in accordance with one embodiment of the present disclosure.

Figure 2:
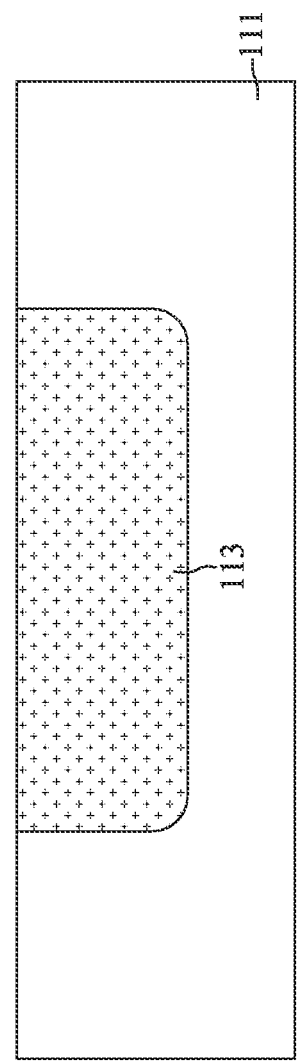
FIGS. 2 to 12 illustrate, in schematic cross-sectional view diagrams, a flow for fabricating the semiconductor device in accordance with one embodiment of the present disclosure.

With reference to FIGS. 1 and 2, at step S11, a substrate 111 may be provided and an impurity region 113 may be formed in the substrate 111.

With reference to FIG. 2, the substrate 111 may include a bulk semiconductor substrate that is composed of at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate III may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

In some embodiments, the substrate 111 may be formed of, for example, doped polycrystalline silicon, doped polycrystalline germanium, or doped polycrystalline silicon germanium. In some embodiments, the substrate 111 may include silicon and/or germanium with substantially no oxygen and nitrogen. As used in this regard, a feature with "substantially no oxygen and nitrogen" has less than 2%, less than 1% or less than 0.5% oxygen and nitrogen on an atomic basis. In some embodiments, the substrate 111 may consist essentially of silicon, germanium, or silicon germanium. As used herein, "consists essentially of" with respect to composition of a layer means that the stated elements compose greater than 95%, greater than 98%, greater than 99% or greater than 99.5% of the stated material on an atomic basis.

With reference to FIG. 2, the impurity region 113 may be formed in the substrate 111 by an implantation process using, for example, n-type dopants. The n-type dopants may be added to an intrinsic semiconductor to contribute free electrons to the intrinsic semiconductor. In a silicon-containing substrate, examples of n-type dopants, i.e., impurities, include but are not limited to antimony, arsenic, and phosphorus. In some embodiments, the dopant concentration of the impurity region 113 may be between about 1E19 atoms/cm^3 and about 1E21 atoms/cm^3; although other dopant concentrations that are lesser than, or greater than, the aforementioned range may also be employed in the present disclosure. In some embodiments, the implantation process may employ, for example, p-type dopants. The term "p-type dopant" refers to an impurity that when added to an intrinsic semiconductor material creates deficiencies of valence electrons. In a silicon containing semiconductor material, examples of p-type dopants include, but are not limited to, boron, aluminum, gallium and/or indium.

With reference to FIG. 1 and FIGS. 3 to 5, at step S13, a bottom conductive layer 101 may be formed on the impurity region 113 and an intervening conductive layer 103 may be formed between the impurity region 113 and the bottom conductive layer 101.

Figure 3:
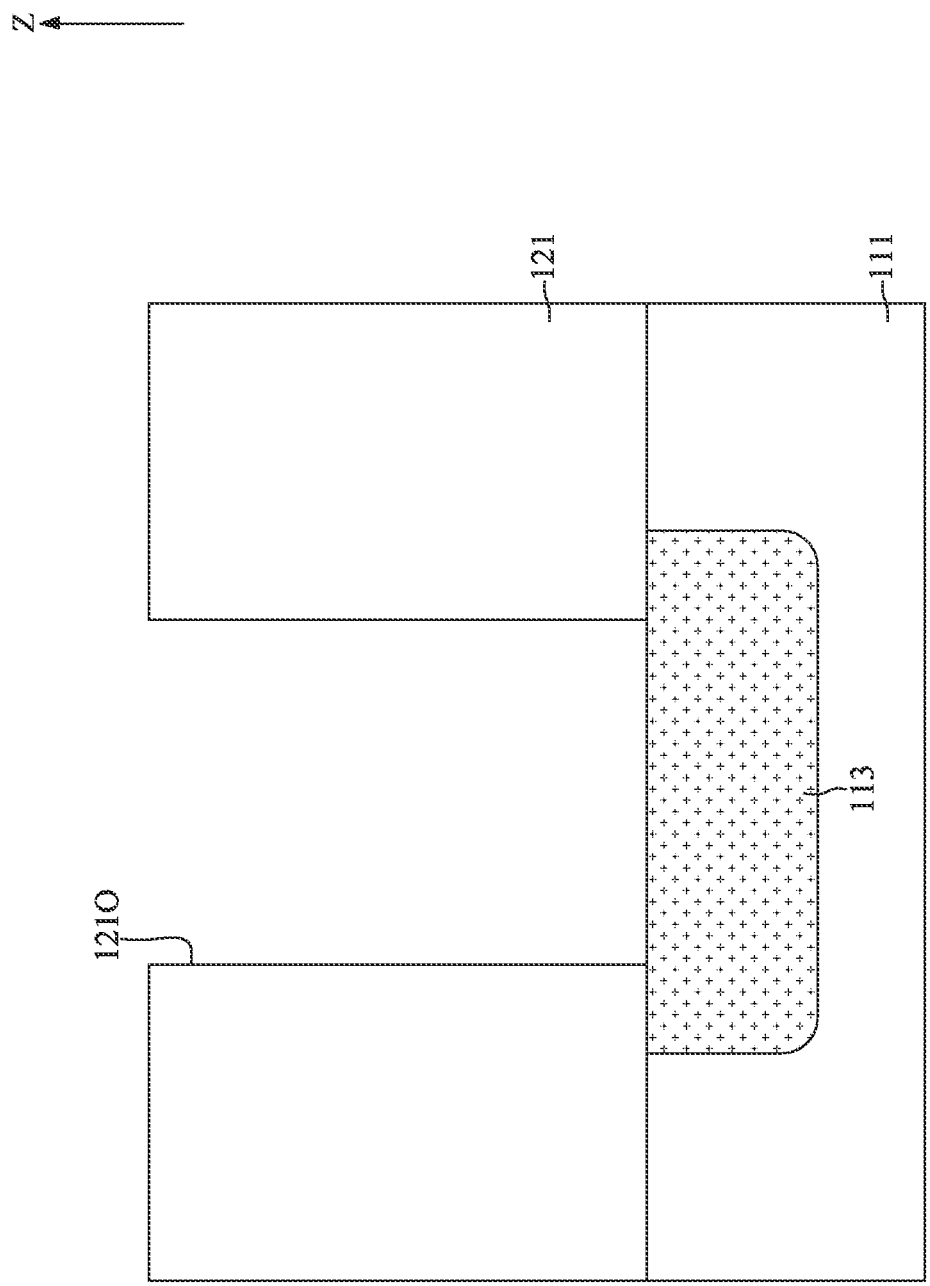

With reference to FIG. 3, a first dielectric layer 121 may be formed on the substrate 111 to cover the impurity region 113. In some embodiments, the first dielectric layer 121 may be formed of, for example, silicon oxide, undoped silicate glass, fluorosilicate glass, borophosphosilicate glass, a spin-on low-k dielectric layer, a chemical vapor deposition low-k dielectric layer, or a combination thereof. In some embodiments, the first dielectric layer 121 may include a self-planarizing material such as a spin-on glass or a spin-on low-k dielectric material such as SiLK™. In some embodiments, the first dielectric layer 121 may be formed by a deposition process including, for example, chemical vapor deposition, plasma enhanced chemical vapor deposition, evaporation, or spin-on coating. In the present embodiment, the first dielectric layer 121 is formed of silicon oxide.

With reference to FIG. 3, a contact opening 121O may be formed along the first dielectric layer 121 to expose a portion of the impurity region 113. The contact opening 121O may be formed by a photolithography process and a subsequent opening etching process. In some embodiments, the etch rate ratio of the first dielectric layer 121 to the impurity region 113 may be between about 100:1 and about 1.05:1, between about 15:1 and about 2:1, or between about 10:1 and about 2:1 during the opening etching process.

Figure 4:
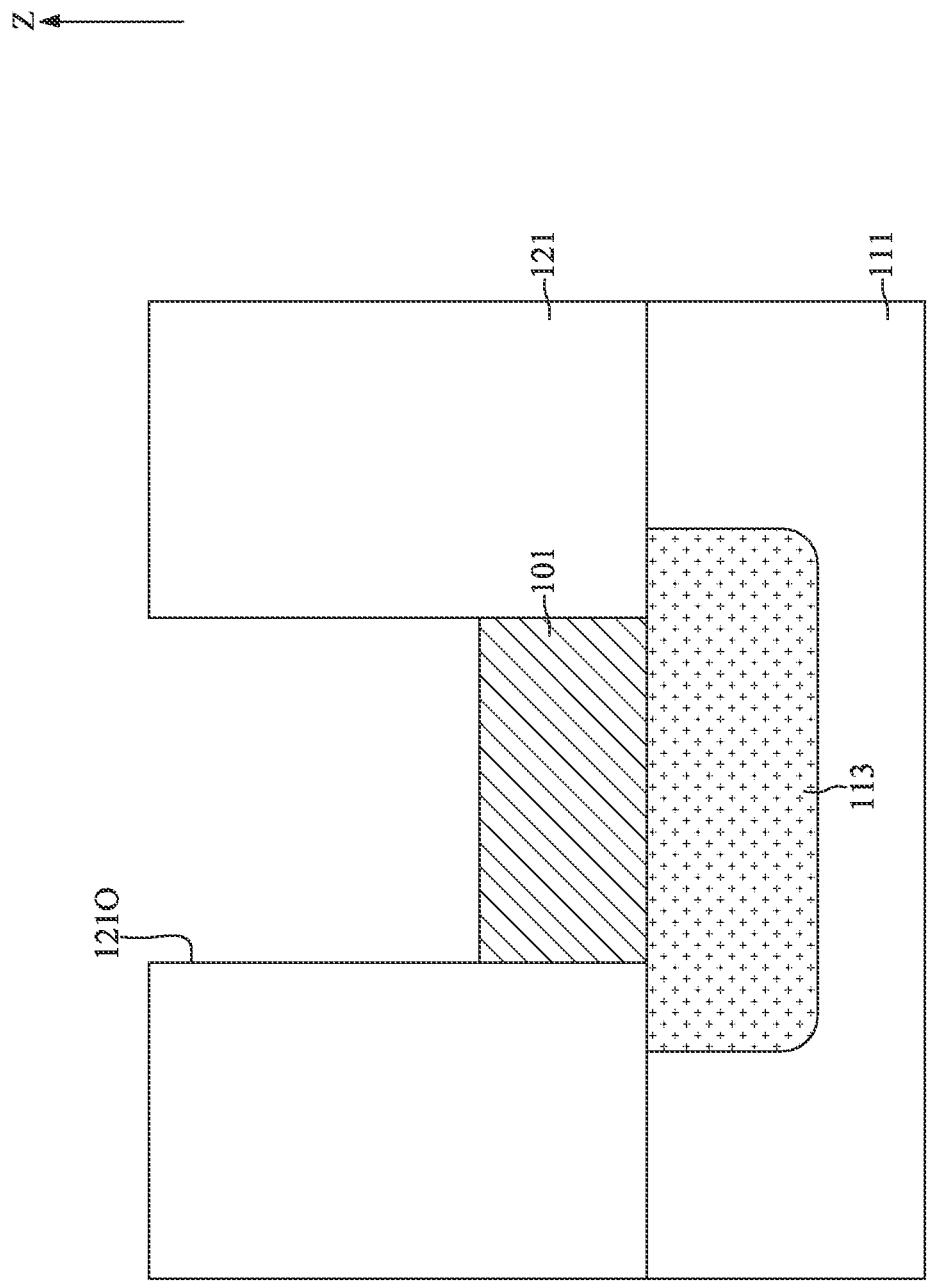

With reference to FIG. 4, the bottom conductive layer 101 may be formed in the contact opening 121O and on the impurity region 113. Detailedly, the bottom conductive layer 101 may be selectively deposited on the impurity region 113 over the first dielectric layer 121. In some embodiments, the bottom conductive layer 101 may be formed of, for example, germanium. In some embodiments, the bottom conductive layer 101 may include an atomic percentage of germanium greater than or equal to 50%. In this regard, the bottom conductive layer 101 may be described as a "germanium-rich layer". In some embodiments, the atomic percentage of germanium in the bottom conductive layer 101 may be greater than or equal to 60%, greater than or equal to 70%, greater than or equal to 80% greater than or equal to 90%, greater than or equal to 95%, greater than or equal to 98%, greater than or equal to 99% or greater than or equal to 99.5%. Stated differently, in some embodiments, the bottom conductive layer 101 consists essentially of germanium.

In some embodiments, the bottom conductive layer 101 may be formed by a deposition process. In some embodiments, the deposition process may include a reactive gas including a germanium precursor and/or hydrogen gas. In some embodiments, the germanium precursor may consist essentially of germane. In some embodiments, the germanium precursor may include one or more of germane, digermane, isobutylgermane, chlorogermane, or dichlorogermane. In some embodiments, the hydrogen gas may be used as a carrier or diluent for the germanium precursor. In some embodiments, the reactive gas may consist essentially of germane and hydrogen gas. In some embodiments, the molar percentage of germane in the reactive gas may be in a range of about 1% to about 50%, in a range of about 2% to about 30%, or in a range of about 5% to about 20%.

In some embodiments, the temperature of the intermediate semiconductor device to be deposited may be maintained during the deposition process. The temperature may be referred to as the substrate temperature. In some embodiments, the substrate temperature may be in a range between about 300° C. and about 800° C., between about 400° C. and about 800° C., between about 500° C. and about 800° C., between about 250° C. and about 600° C., between about 400° C. and about 600° C., or between about 500° C. and about 600° C. In some embodiments, the substrate temperature may be about 540° C.

In some embodiments, the pressure of the processing chamber for depositing the bottom conductive layer 101 may be maintained during the deposition process. In some embodiments, the pressure is maintained in a range between about 1 Torr and about 300 Torr, between about 10 Torr and about 300 Torr, between about 50 Torr and about 300 Torr, between about 100 Torr and 300 Torr, between about 200 Torr and about 300 Torr, or between about 1 Torr and about 20 Torr. In some embodiments, the pressure may be maintained at about 13 Torr.

In some embodiments, the selectivity of the deposition may be greater than or equal to 5, greater than or equal to 10, greater than or equal to 20, greater than or equal to 30, or greater than or equal to 50. In some embodiments, the bottom conductive layer 101 may be deposited on the impurity region 113 to a thickness before deposition is observed on the first dielectric layer 121.

It should be noted that, in the description of the present disclosure, the term "selectively depositing a layer on a first feature over a second feature", and the like, means that a first amount of the layer is deposited on the first feature and a second amount of the layer is deposited on the second feature, where the first amount of the layer is greater than the second amount of the layer, or no layer is deposited on the second feature. The selectivity of a deposition process may be expressed as a multiple of growth rate. For example, if one surface is deposited on twenty-five times faster than a different surface, the process would be described as having a selectivity of 25:1 or simply 25. In this regard, higher ratios indicate more selective deposition processes.

The term "over" used in this regard does not imply a physical orientation of one feature on top of another feature, rather a relationship of the thermodynamic or kinetic properties of the chemical reaction with one feature relative to the other feature. For example, selectively depositing a germanium layer onto a silicon surface over a dielectric surface means that the germanium layer deposits on the metal surface and less or no germanium layer deposits on the dielectric surface; or that the formation of a germanium layer on the silicon surface is thermodynamically or kinetically favorable relative to the formation of a germanium layer on the dielectric surface.

In some embodiments, a pre-cleaning process such as wet etch or dry etch may be performed to remove contaminants before the formation of the bottom conductive layer 101. In some embodiments, the wet etch process may utilize ammonia or hydrogen fluoride solution. In some embodiments, the dry etch process may be a plasma etch process and may utilize a fluorine or hydrogen containing etchant. The pre-cleaning process would not substantially remove any portion of the impurity region 113.

With reference to FIG. 4, an implantation process may be performed to the bottom conductive layer 101. The implantation process may employ n-type dopants or p-type of dopants. The n-type dopants may include but are not limited to antimony, arsenic, and/or phosphorus. The p-type dopants may include, but are not limited to, boron, aluminum, gallium and/or indium. In some embodiments, the dopant concentration of the bottom conductive layer 101 and the dopant concentration of the impurity region 113 may be substantially the same. In some embodiments, the dopant concentration of the bottom conductive layer 101 and the dopant concentration of the impurity region 113 may be different.

Figure 5:
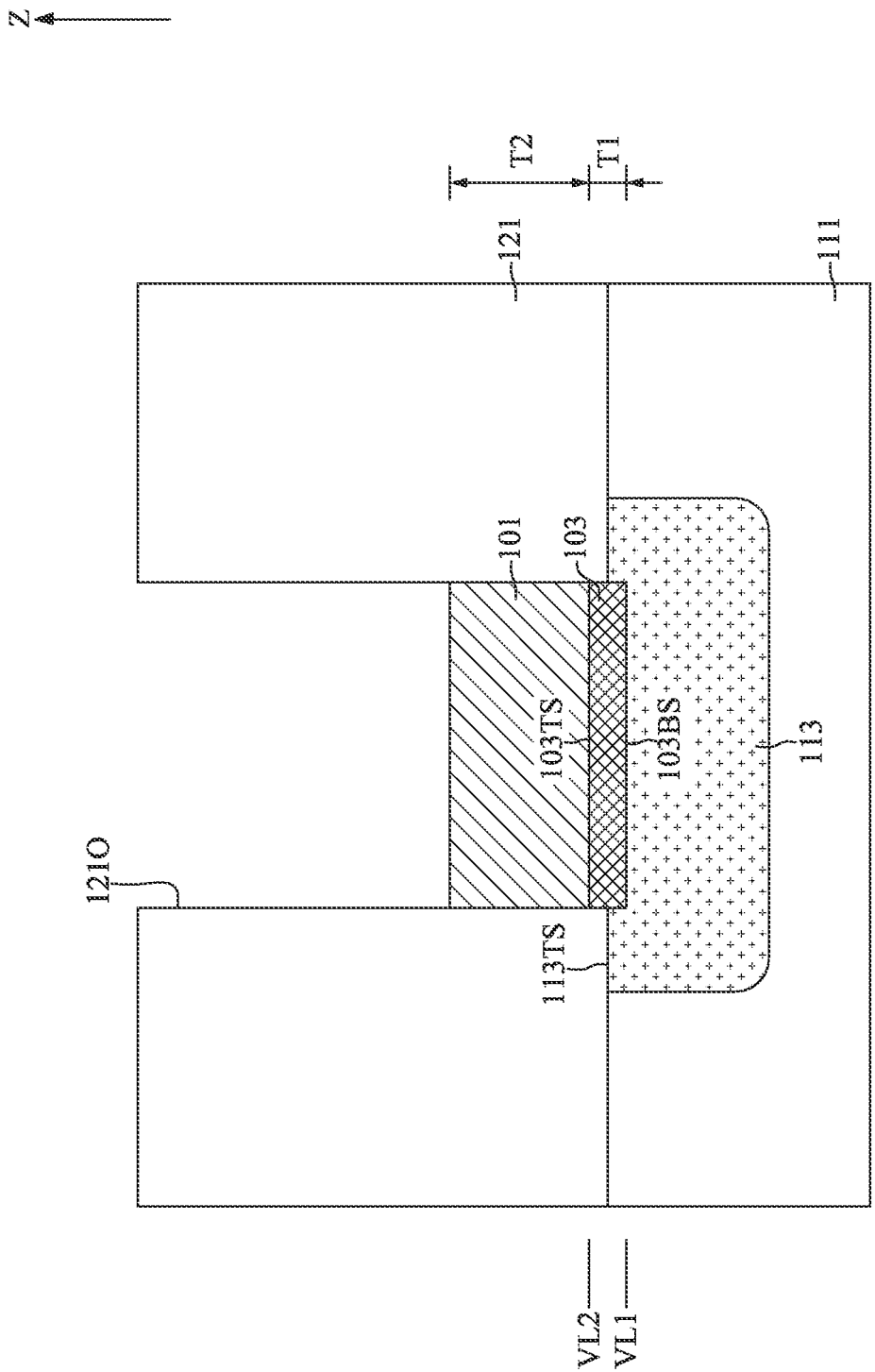

With reference to FIG. 5, an annealing process may be performed to activate the impurity region 113 and the bottom conductive layer 101. The annealing process may have a process temperature between about 800° C. and about 1250° C. The annealing process may have a process duration between about 1 millisecond and about 500 milliseconds. The annealing process may be, for example, a rapid thermal annealing, a laser spike annealing, or a flash lamp annealing. After the annealing process, the intervening conductive layer 103 may be formed between the bottom conductive layer 101 and the impurity region 113.

With reference to FIG. 5, in some embodiments, the bottom surface 103BS of the intervening conductive layer 103 may be at a vertical level VL1 lower than the top surface 113TS of the impurity region 113 (i.e., the top surface of the substrate 111). The top surface 103TS of the intervening conductive layer 103 may be at a vertical level VL2 higher than the top surface 113TS of the impurity region 113.

It should be noted that, in the description of the present disclosure, a surface of an element (or a feature) located at the highest vertical level along the dimension Z is referred to as a top surface of the element (or the feature). A surface of an element (or a feature) located at the lowest vertical level along the dimension Z is referred to as a bottom surface of the element (or the feature).

With reference to FIG. 5, in some embodiments, the thickness ratio of the thickness T1 of the intervening conductive layer 103 to the thickness T2 of the bottom conductive layer 101 may be between about 0.01 and about 0.15, between about 0.02 and about 0.10, or between about 0.02 and about 0.06.

With reference to FIG. 1 and FIGS. 6 to 11, at step S15, a conductive capping layer 105 may be formed on the bottom conductive layer 101.

Figure 6:
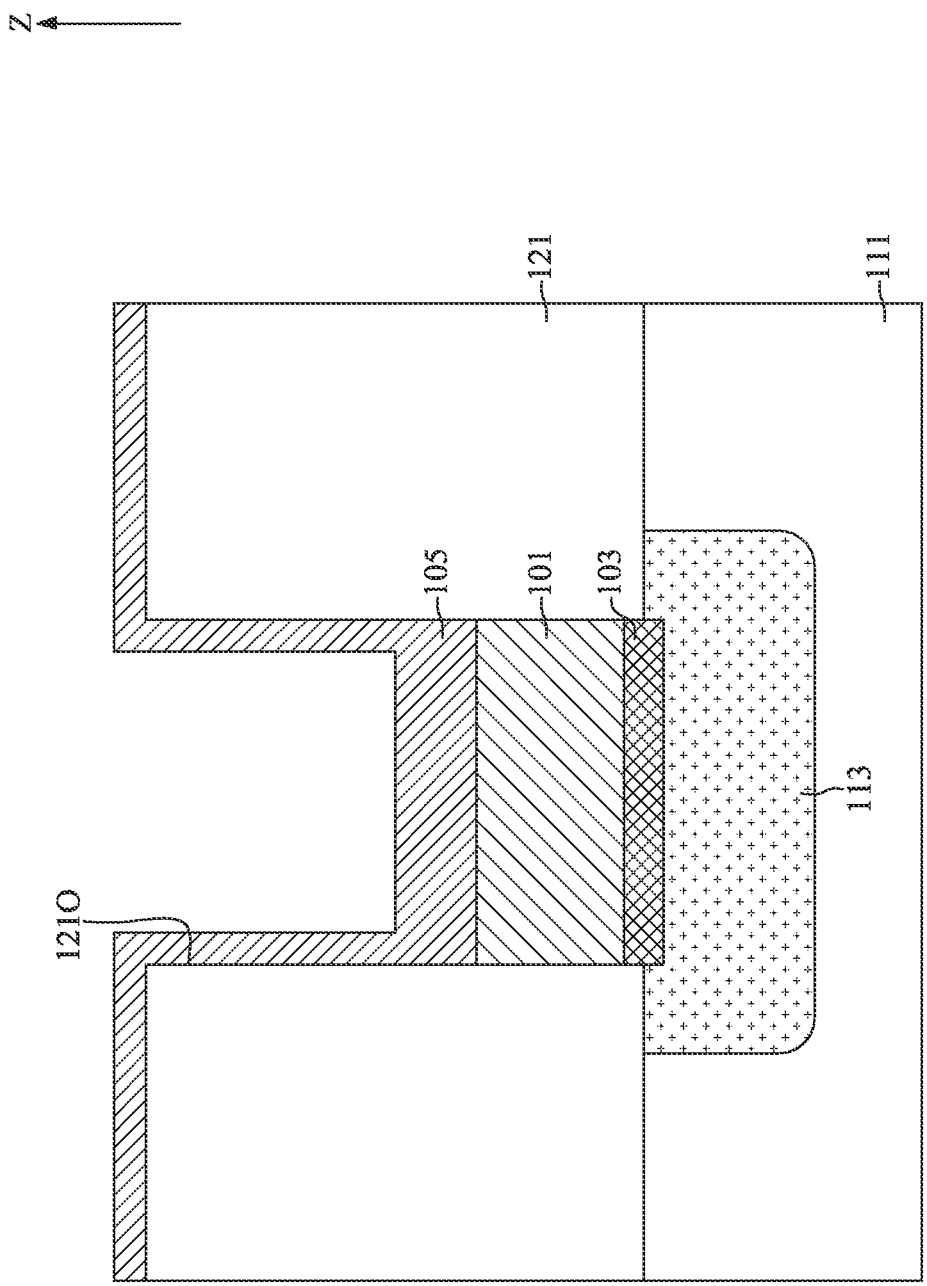

With reference to FIG. 6, the conductive capping layer 105 may be conformally formed on the bottom conductive layer 101, in the contact opening 121O, and on the top surface of the first dielectric layer 121. In some embodiments, the conductive capping layer 105 may be formed of, for example, tungsten, ruthenium, molybdenum, or alloys thereof. In some embodiments, the conductive capping layer 105 may be formed of a metal nitride such as tungsten nitride, titanium nitride, or other applicable conductive metal nitrides. In the present embodiment, the conductive capping layer 105 is formed of tungsten nitride. In some embodiments, the conductive capping layer 105 may be formed by, for example, low energy physical vapor deposition, chemical vapor deposition, atomic layer deposition, or other applicable deposition processes. For example, in the present embodiment, the conductive capping layer 105 formed of tungsten nitride is formed by atomic layer deposition.

Generally, the atomic layer deposition may alternately supply two (or more) different source gases one by one onto a process object under predetermined process conditions, so that chemical species is adsorbed to the process object at a single atomic layer level and are deposited on the process object through surface reactions. For instance, first and second source gases are alternately supplied to a process object to flow along the surface thereof, thereby molecules contained in the first source gas adsorb to the surface, and molecules contained in the second source gas react with the adsorbed molecules originated from the first source gas to form a film of a thickness of a single molecule level. The above process steps are performed repeatedly to obtain the layer with desired thickness.

In the present embodiment, the atomic layer deposition of forming the conductive capping layer 105 may be carried out by the following steps. First, borane is supplied to deposit boron atoms at a surface of the bottom conductive layer 101, the contact opening 121O, and the top surface of the first dielectric layer 121. Argon is supplied to purge the system and tungsten fluoride is supplied to substitute the deposited boron atoms with tungsten atoms. Argon is supplied to purge the system, and then ammonia is supplied to react the tungsten atoms with nitrogen atoms, thereby forming the conductive capping layer 105 formed of tungsten nitride. Subsequently, argon gas is supplied to purge remaining gases. These steps can be repeatedly carried out to form the conductive capping layer 105 having a desirable thickness. In some embodiments, each of the gases may have a flow rate of, for example, between about 400 standard cubic centimeters per minute (sccm) and 600 sccm. In some embodiments, the atomic layer deposition of forming the conductive capping layer 105 may be carried out at a pressure between about 1 mTorr and 100 Torr and may be carried at a temperature less than 600° C.

Figure 7:
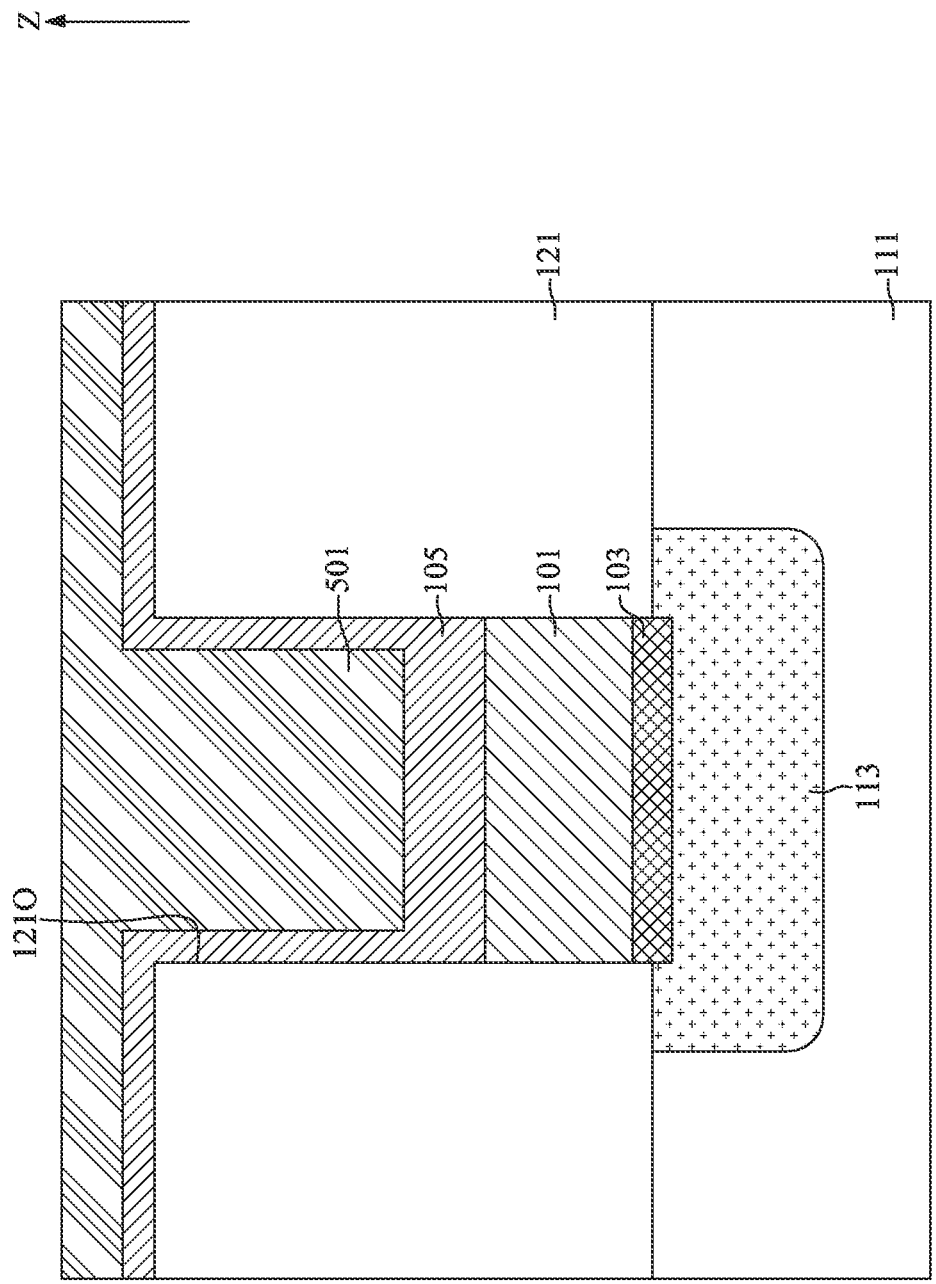

With reference to FIG. 7, the sacrificial filler layer 501 may be formed on the conductive capping layer 105 and completely fill the contact opening 121O. In some embodiments, the sacrificial filler layer 501 may be formed of, for example, a spin-on or gap-fill material. In some embodiments, the spin-on material may be a carbon-based material. In some embodiments, the gap-fill material may be a dielectric material.

Figure 8:
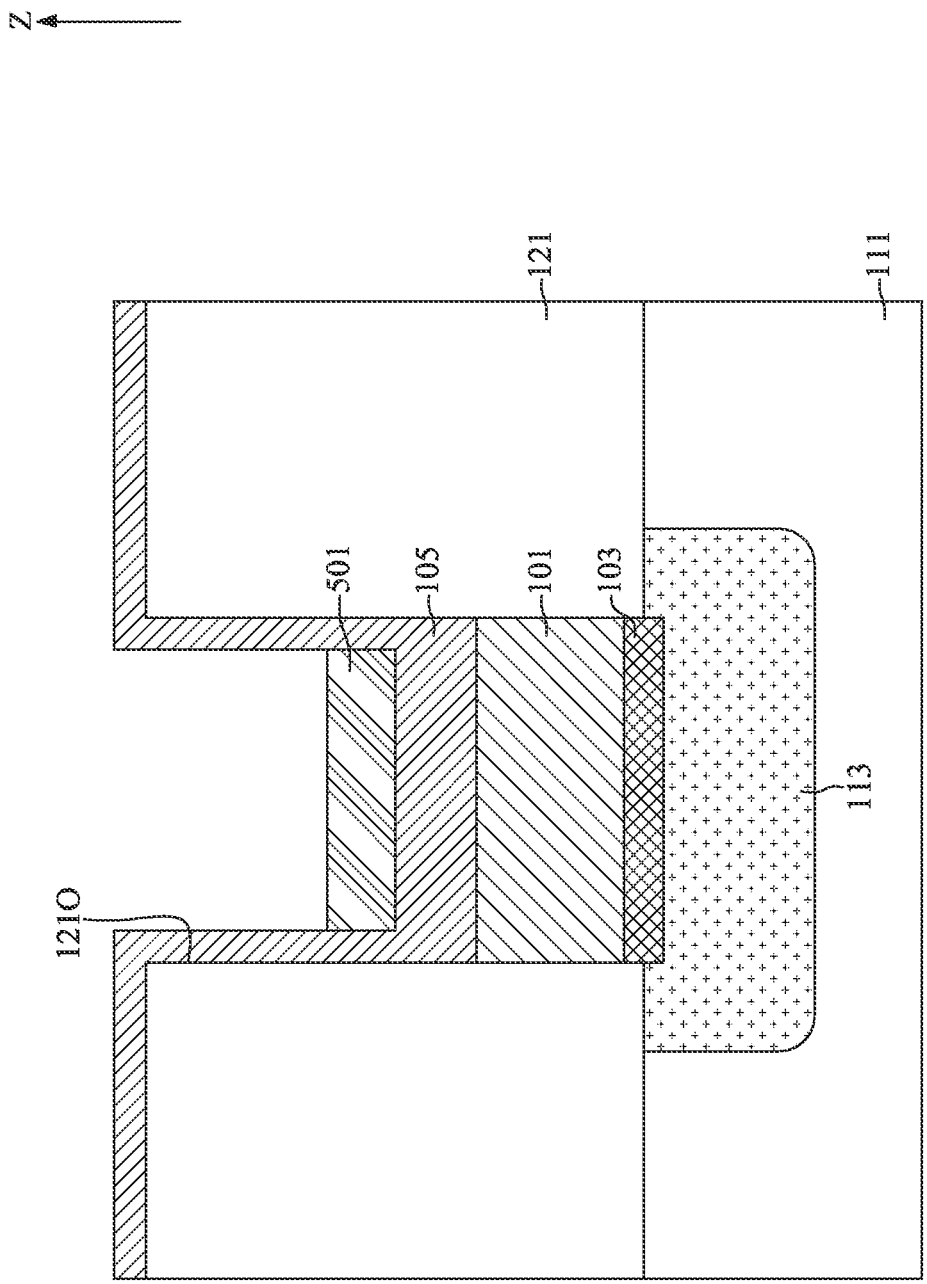

With reference to FIG. 8, the sacrificial filler layer 501 may be recessed to a vertical level lower than the top surface of the first dielectric layer 121. For example, for the sacrificial filler layer 501 formed of the spin-on material, etching may be conducted by a dry etch process, which may utilize a plasma etch process and may utilize a hydrogen or nitrogen or oxygen containing etchant. The etch rate ratio of the sacrificial filler layer 501 to the conductive capping layer 105 may be between about 100:1 and about 1.05:1, between about 15:1 and about 2:1, or between about 10:1 and about 2:1 during the dry etch process.

Alternatively, in some embodiments, after depositing the sacrificial filler layer 501 in FIG. 7, a planarization process, such as chemical mechanical polishing, may be performed to remove at least a portion of the sacrificial filler layer 501 and the conductive capping layer 105 above the top surface of the first dielectric layer 121. Subsequently, an etching process may be performed to recess the sacrificial filler layer 501 to a vertical level lower than the top surface of the first dielectric layer 121. The etch rate ratio of the sacrificial filler layer 501 to the conductive capping layer 105 may be between about 100:1 and about 1.05:1, between about 15:1 and about 2:1, or between about 10:1 and about 2:1 during the etching process.

Figure 9:
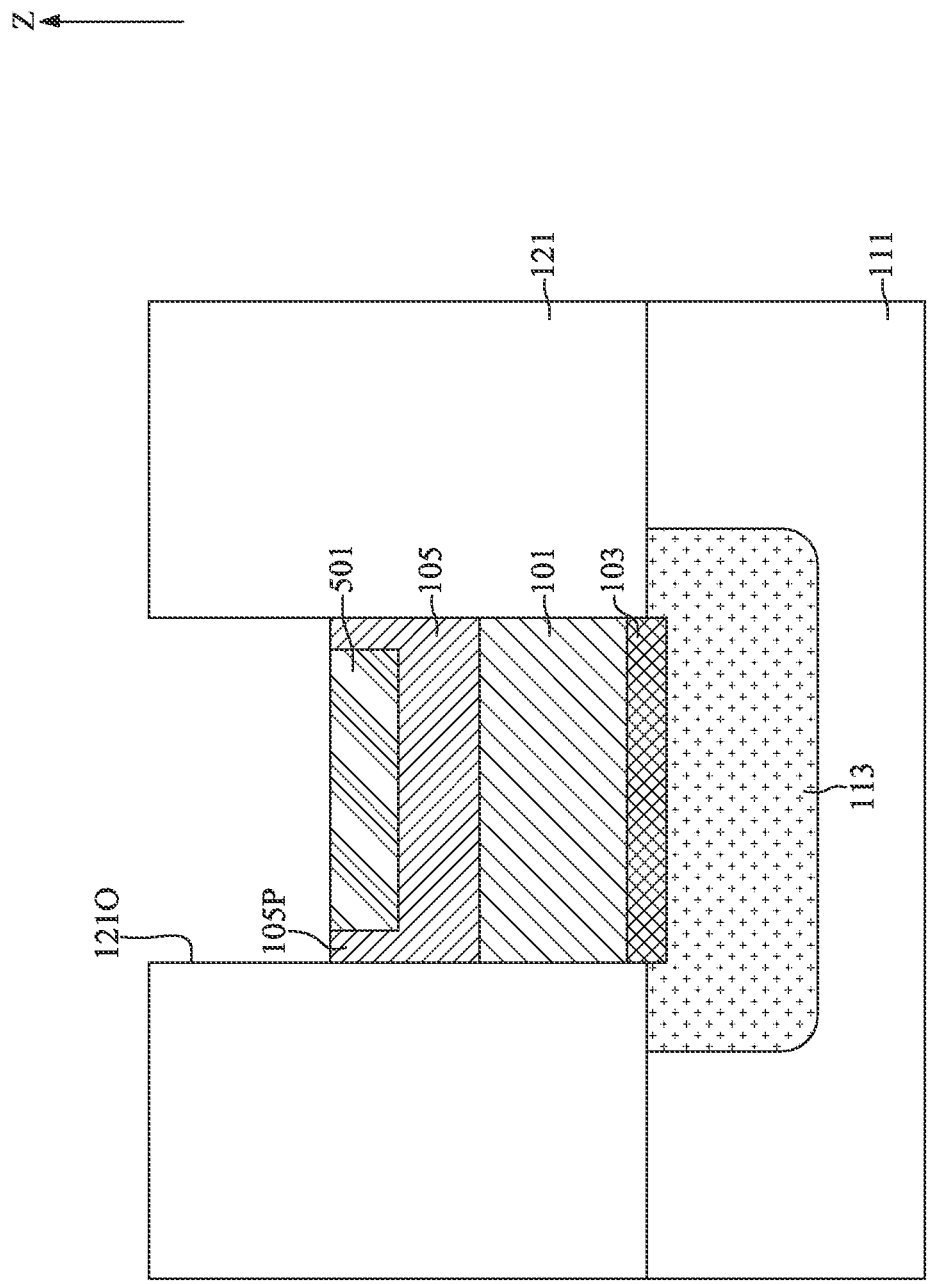

With reference to FIG. 9, portions of the conductive capping layer 105 may be removed by a first trimming process. The first trimming process may be an etch process. In some embodiments, the etch rate ratio of the conductive capping layer 105 to the sacrificial filler layer 501 may be between about 100:1 and about 1.05:1, between about 15:1 and about 2:1, or between about 10:1 and about 2:1 during the first trimming process. In some embodiments, the etch rate ratio of the conductive capping layer 105 to the first dielectric layer 121 may be between about 100:1 and about 1.05:1, between about 15:1 and about 2:1, or between about 10:1 and about 2:1 during the first trimming process. After the first trimming process, the conductive capping layer 105 may include two protruding portions 105P extending upward and disposed on the contact opening 121O. The top surfaces of the two protruding portions 105P and the top surface of the sacrificial filler layer 501 may be substantially coplanar.

Figure 10:
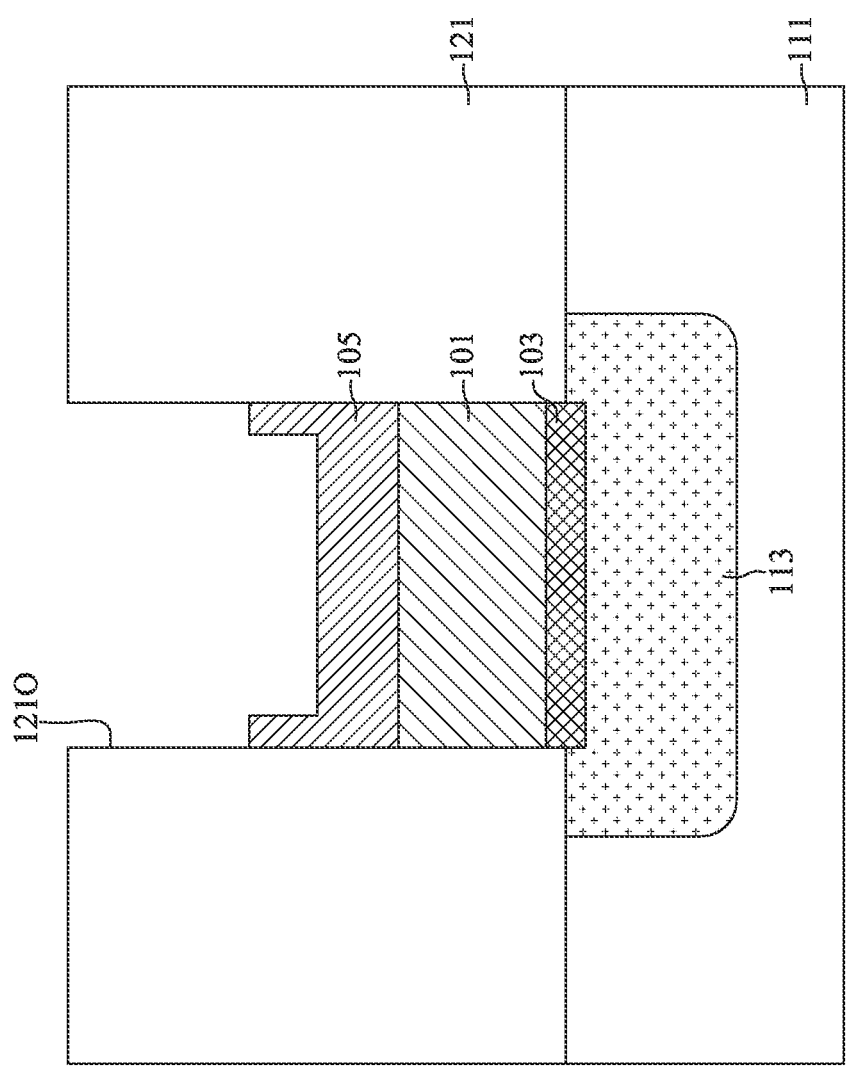

With reference to FIG. 10, the remaining sacrificial filler layer 501 may be removed with an etch process similar to that illustrated in FIG. 8, and descriptions thereof are not repeated herein.

Figure 11:
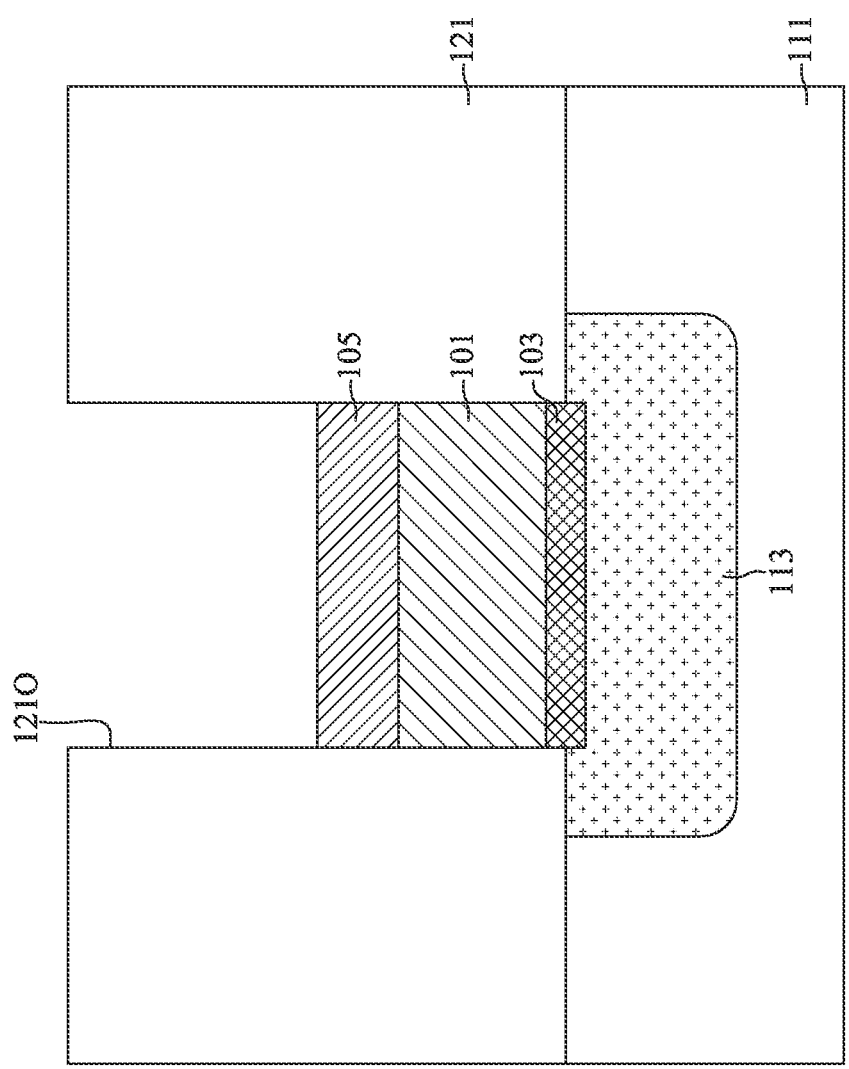

With reference to FIG. 11, the two protruding portions 105P may be removed by a second trimming process. In some embodiments, the second trimming process may be, for example, a wet etch process or a dry etch process. In some embodiments, second trimming process may be, for example, an etch process employing oxygen-, fluorine-, or chlorine-based gas.

Figure 12:
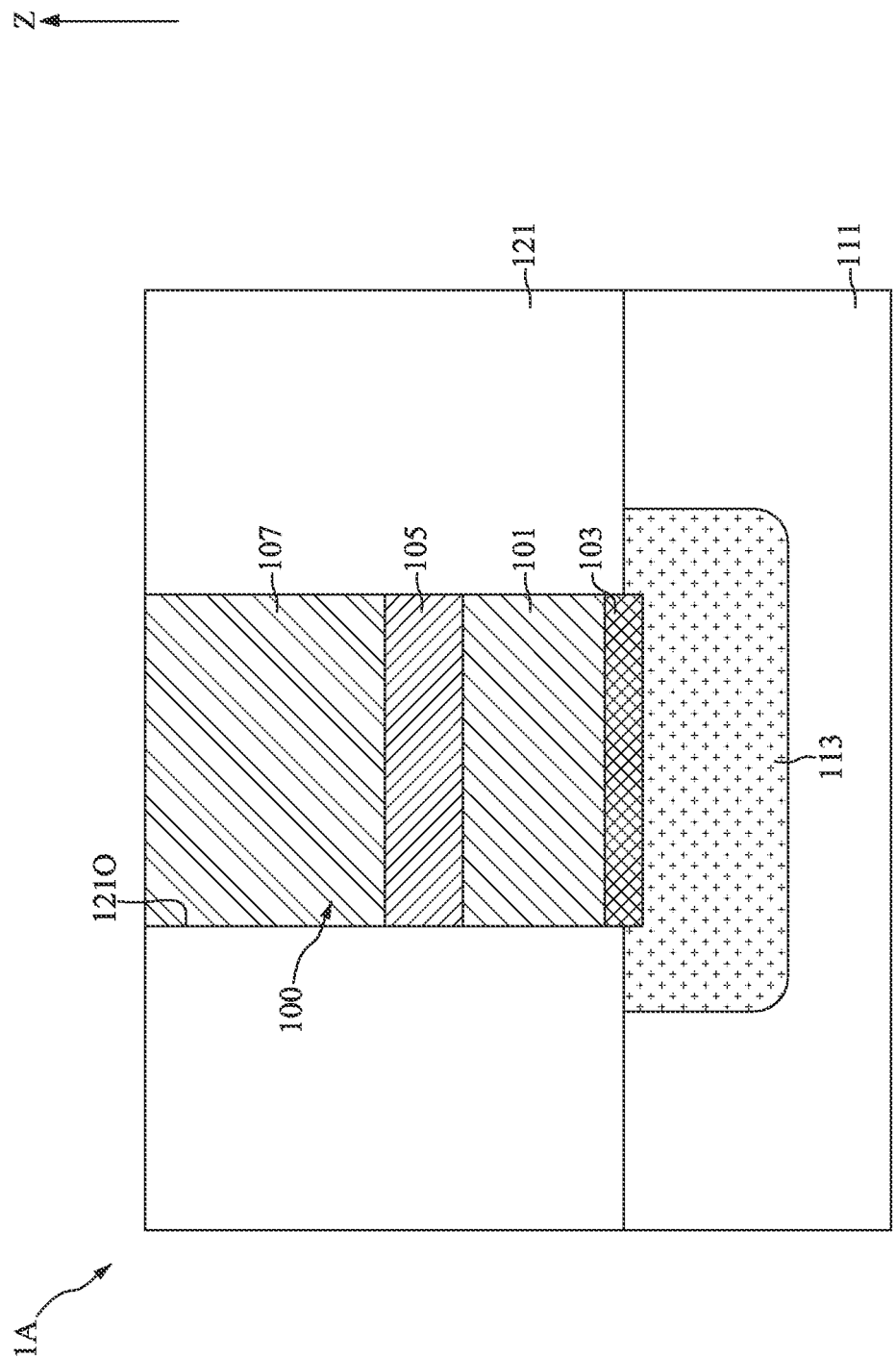

With reference to FIGS. 1 and 12, at step S17, a top conductive layer 107 may be formed on the conductive capping layer 105 to configure a contact structure 100.

With reference to FIG. 12, the top conductive layer 107 may be formed of an electrically conductive material, such as a metal. In some embodiments, the top conductive layer 107 may include a metal selected from the group consisting of: tungsten, ruthenium, and cobalt. In some embodiments, the top conductive layer 107 may be formed by a selective deposition method. In some embodiments, the top conductive layer 107 may be formed by chemical vapor deposition or physical vapor deposition. In general, any suitable precursor can be used for forming the top conductive layer 107. For example, precursors of the top conductive layer 107 formed of tungsten may include, but are not limited to tungsten hexachloride, tungsten hexabromide, tungsten (IV) iodide, or tungsten hexafluoride.

In some embodiments, the metal contained in the top conductive layer 107 may be the same as the metal for forming the metal nitride contained in the conductive capping layer 105. For example, the top conductive layer 107 may be formed of tungsten and the conductive capping layer 105 may be formed of tungsten nitride.

In some embodiments, prior to deposition of the top conductive layer 107, a pre-clean process may be performed. In some embodiments, the pre-clean process prior to deposition of the top conductive layer 107 may include a plasma treatment, e.g., hydrogen plasma.

In some embodiments, a planarization process, such as chemical mechanical polishing, may be performed until the top surface of the first dielectric layer 121 is exposed to remove excess material and provide a substantially flat surface for subsequent processing steps.

With reference to FIG. 12, the intervening conductive layer 103, the bottom conductive layer 101, the conductive capping layer 105, and the top conductive layer 107 together configure the contact structure 100.

By employing the bottom conductive layer 101 formed of germanium, the resistance of the contact structure 100 may be reduced. As a result, the performance of the semiconductor device 1A including the contact structure 100 may be improved.

Figure 13:
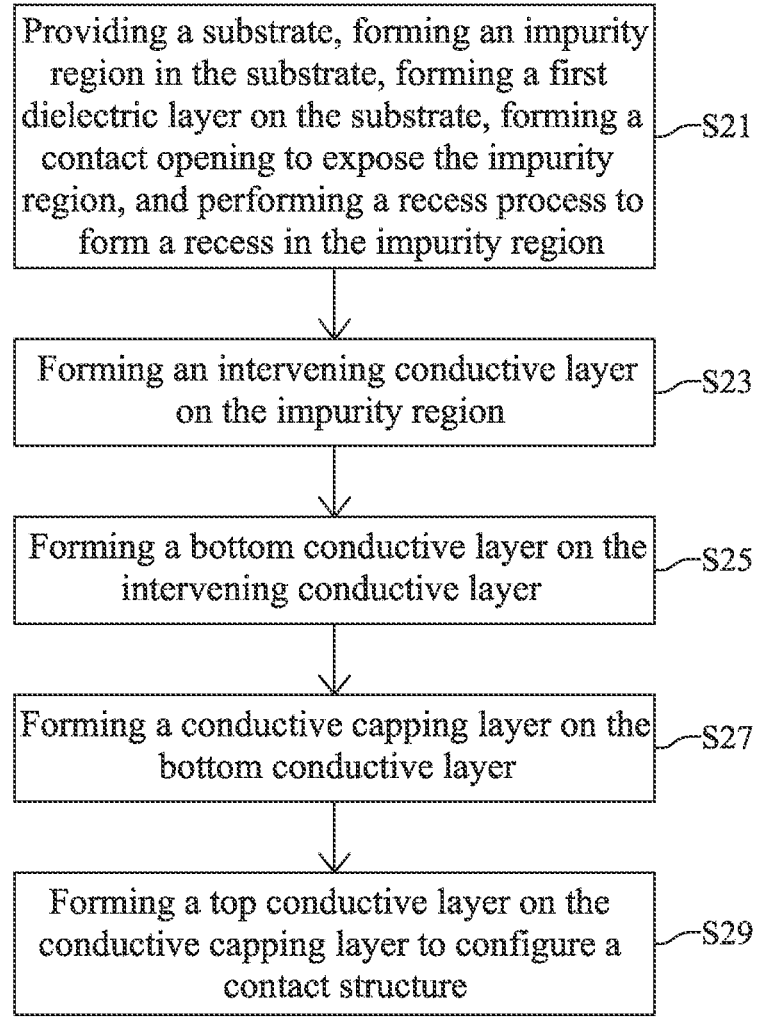
FIG. 13 illustrates, in a flowchart diagram form, a method for fabricating a semiconductor device in accordance with another embodiment of the present disclosure.

FIG. 13 illustrates, in a flowchart diagram form, a method 20 for fabricating a semiconductor device 1B in accordance with another embodiment of the present disclosure. FIGS. 14 to 20 illustrate, in schematic cross-sectional view diagrams, a flow for fabricating the semiconductor device 1B in accordance with another embodiment of the present disclosure.

Figure 14:
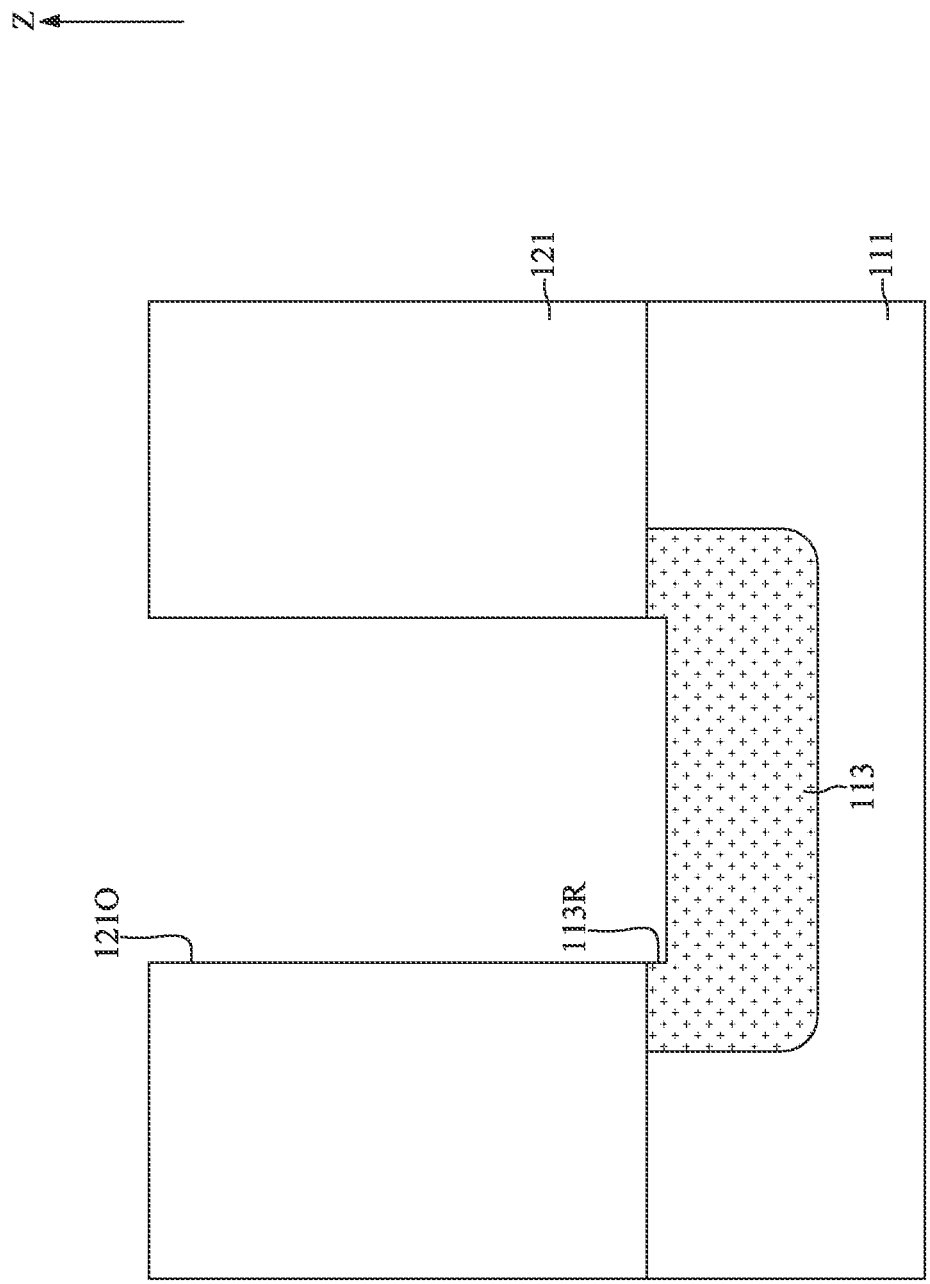
FIGS. 14 to 20 illustrate, in schematic cross-sectional view diagrams, a flow for fabricating the semiconductor device in accordance with another embodiment of the present disclosure.

With reference to FIGS. 13 and 14, at step S21, a substrate 111 may be provided, an impurity region 113 may be formed in the substrate 111, a first dielectric layer 121 may be formed on the substrate 111, a contact opening 121O may be formed to expose the impurity region 113, and a recess process may be performed to form a recess 113R in the impurity region 113.

With reference to FIG. 14, in some embodiments, the substrate 111 may be provided with a procedure similar to that illustrated in FIG. 2, and descriptions thereof are not repeated herein.

In some embodiments, the substrate 111 may include an epitaxial material such as epitaxial silicon, epitaxial germanium, or epitaxial silicon germanium on the top of the substrate 111. The epitaxial material may be formed by a deposition process that includes exposing the top surface of the substrate 111 to a deposition gas containing at least a silicon source and a carrier gas.

Detailedly, the deposition process may begin by adjusting the process chamber containing the substrate 111 to a predetermined temperature and pressure. The temperature may be tailored to the particular conducted process. In some embodiments, the process chamber may be kept at a temperature in the range from about 250° C. to about 1000° C., from about 500° C. to about 800° C., or from about 550° C. to about 750° C. The appropriate temperature to conduct deposition process may depend on the particular precursors used to deposit the epitaxial material. In some embodiments, the process chamber may be usually maintained at a pressure from about 0.1 Torr to about 200 Torr, or from about 1 Torr to about 50 Torr. The pressure may fluctuate during the deposition process but is generally maintained constant.

After the process chamber is tuned to the appropriate temperature and pressure, the substrate 111 may be exposed to the deposition gas containing the silicon source and the carrier gas to form the epitaxial material. In some embodiments, the substrate 111 may be exposed to the deposition gas for a period of time of about 0.5 seconds to about 30 seconds, from about 1 second to about 20 seconds, or from about 5 seconds to about 10 seconds. The specific exposure time of the deposition process may be determined in relation to the particular precursors, temperature, and pressure used in the deposition process.

In some embodiments, the silicon source may be usually provided into the process chamber at a rate in a range from about 5 sccm to about 500 sccm, from about 10 sccm to about 300 sccm, or from about 50 sccm to about 200 sccm. For example, the silicon source may be provided into the process chamber at a rate about 100 sccm.

In some embodiments, the silicon source may include silanes, halogenated silanes, and/or organosilanes. In some embodiments, silanes may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. In some embodiments, halogenated silanes may include compounds with the empirical formula $X'_ySi_xH_{(2x+2-y)}$, where X' is F, Cl, Br or I, such as hexachlorodisilane ($Si_2Cl_6$), tetrachlorosilane ($SiCl_4$), dichlorosilane ($Cl_2SiH_2$), and trichlorosilane ($Cl_3SiH$). In some embodiments, organosilanes may include compounds with the empirical formula $R_ySi_xH_{(2x+2-y)}$, where R is methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyidisilane (($CH_3$)$_2Si_2H_4$), and hexamethyldisilane (($CH_3$)$_6Si_2$).

The silicon source is provided into the process chamber along with the carrier gas. In some embodiments, the carrier gas may have a flow rate from about 1 slm (standard liters per minute) to about 100 slm, from about 5 slm to about 75 slm, or from about 10 slm to about 50 slm. In the present embodiment, the flow rate of the carrier gas may be, for example, about 25 slm.

The carrier gas may be selected based on the precursor (e.g., the silicon source) used and/or the process temperature during the deposition process. Usually, the carrier gas is the same throughout the deposition process. However, some embodiments may use different carrier gases during the deposition process. In some embodiments, the carrier gas may include nitrogen, hydrogen, argon, helium, or a combination thereof. In some embodiments, an inert carrier gas may be preferred and includes nitrogen, argon, helium, and a combination thereof.

After the epitaxial material is formed, the process chamber may be flushed with a purge gas or the carrier gas and/or the process chamber may be evacuated with a vacuum pump. The purging and/or evacuating processes remove excess deposition gas, reaction by-products and other contaminants.

In some embodiments, the deposition gas for depositing the epitaxial material may include at least the silicon source and the carrier gas, and may include at least one secondary elemental source, such as a germanium source and/or a carbon source. In some embodiments, the deposition gas may further include a dopant compound to provide a source of a dopant, such as boron, arsenic, phosphorus, gallium and/or aluminum.

With reference to FIG. 14, the impurity region 113, the first dielectric layer 121, and the contact opening 121O may be formed in the substrate 111 with a procedure similar to that illustrated in FIGS. 2 and 3, and descriptions thereof are not repeated herein.

With reference to FIG. 14, the recess process may be performed to remove a portion of the impurity region 113 and extend the contact opening 121O to the impurity region 113. The extending portion of the contact opening 121O may be referred to as the recess 113R. In some embodiments, the recess process may be an etch process. The etch process may be an isotropic etch process such as a wet etch process or an anisotropic etch process such as a dry etch process. In some embodiments, the etch rate ratio of the impurity region 113 to the first dielectric layer 121 may be between about 20:1 and about 1.05:1, between about 15:1 and about 2:1, or between about 10:1 and about 2:1 during the recess process.

Figure 15:
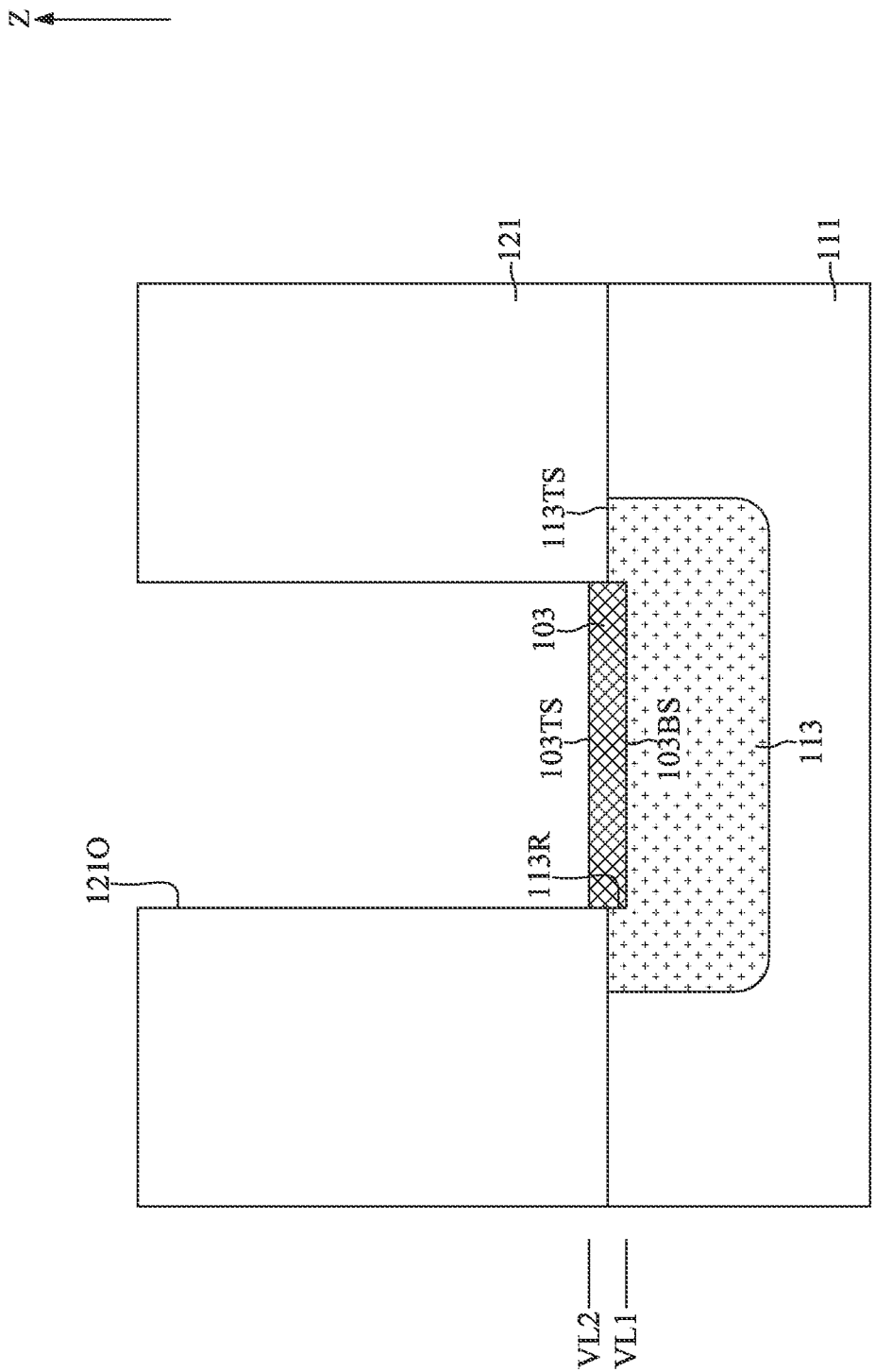

With reference to FIGS. 13 and 15, at step S23, an intervening conductive layer 103 may be formed on the impurity region 113.

With reference to FIG. 15, the intervening conductive layer 103 may be formed of, for example, silicon germanium. In some embodiments, the intervening conductive layer 103 may be formed by an epitaxial process including exposing the recess 113R to a silicon source, a germanium source, and a carrier gas. The silicon source may be provided similar to that illustrated in FIG. 14, and descriptions thereof are not repeated herein.

The germanium source is added to the process chamber with the silicon source and carrier gas to form the intervening conductive layer 103 including a silicon germanium material. The germanium source may be provided into the process chamber at a rate in the range from about 0.1 sccm to about 20 sccm, from about 0.5 sccm to about 10 sccm, or from about 1 sccm to about 5 sccm. In some embodiments, the flow rate of the germanium source may be, for example, about 2 sccm.

In some embodiments, the germanium sources may include, for example, germane ($GeH_4$), higher germanes and organogermanes. In some embodiments, the higher germanes may include compounds with the empirical formula $Ge_xH_{(2x+2)}$, such as digermane ($Ge_2H_6$), trigermane ($Ge_3H$) and tetragermane ($Ge_4H_{10}$), as well as others. In some embodiments, organogermanes may include compounds such as methylgermane (($CH_3$)$GeH_3$), dimethylgermane (($CH_3$)$_2GeH_2$), ethylgermane (($CH_3CH_2$)$GeH_3$), methyldigermane (($CH_3$)$Ge_2H_5$), dimethyidigermane (($CH_3$)$_2Ge_2H_4$) and hexamethyldigermane (($CH_3$)$_6Ge_2$).

In some embodiments, the germanium concentration in the intervening conductive layer 103 may be in the range from about 1 atomic % (at %) to about 30 at %, for example, about 20 at %. The germanium concentration may be graded within the intervening conductive layer 103. For example, the germanium concentration may be graded with a higher germanium concentration in the lower portion of the intervening conductive layer 103 than in the upper portion of the intervening conductive layer 103.

With reference to FIG. 15, the bottom surface 103BS of the intervening conductive layer 103 may be at a vertical level VL1 lower than the top surface 113TS of the impurity region 113. The top surface 103TS of the intervening conductive layer 103 may be at a vertical level VL2 higher than the top surface 113TS of the impurity region 113.

Figure 16:
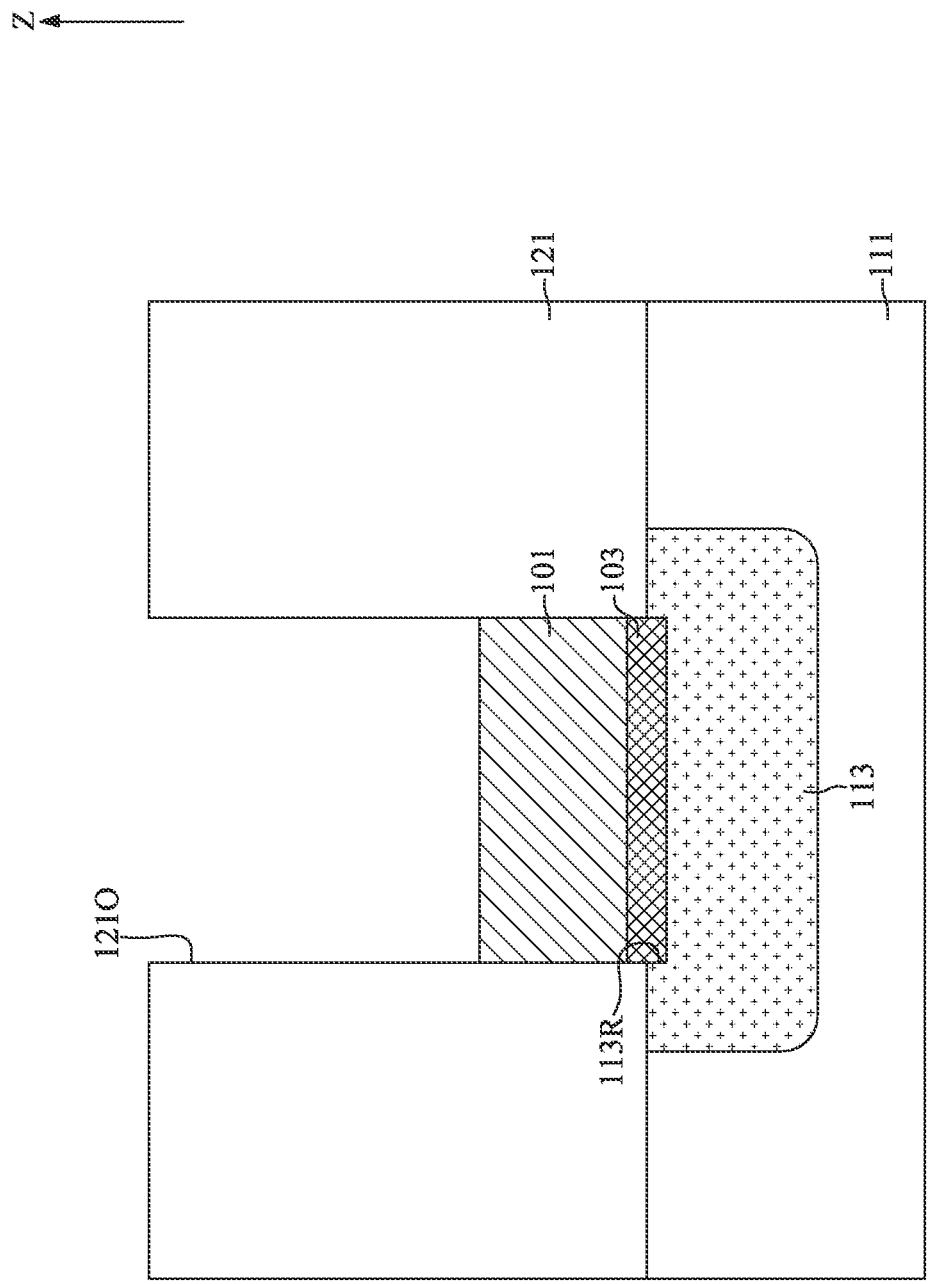

With reference to FIGS. 13 and 16, at step S25, a bottom conductive layer 101 may be formed on the intervening conductive layer 103.

With reference to FIG. 16, the bottom conductive layer 101 may be formed on the intervening conductive layer 103 and in the contact opening 121O. The bottom conductive layer 101 may be formed with a procedure similar to that illustrated in FIG. 4, and descriptions thereof are not repeated herein.

Figure 17:
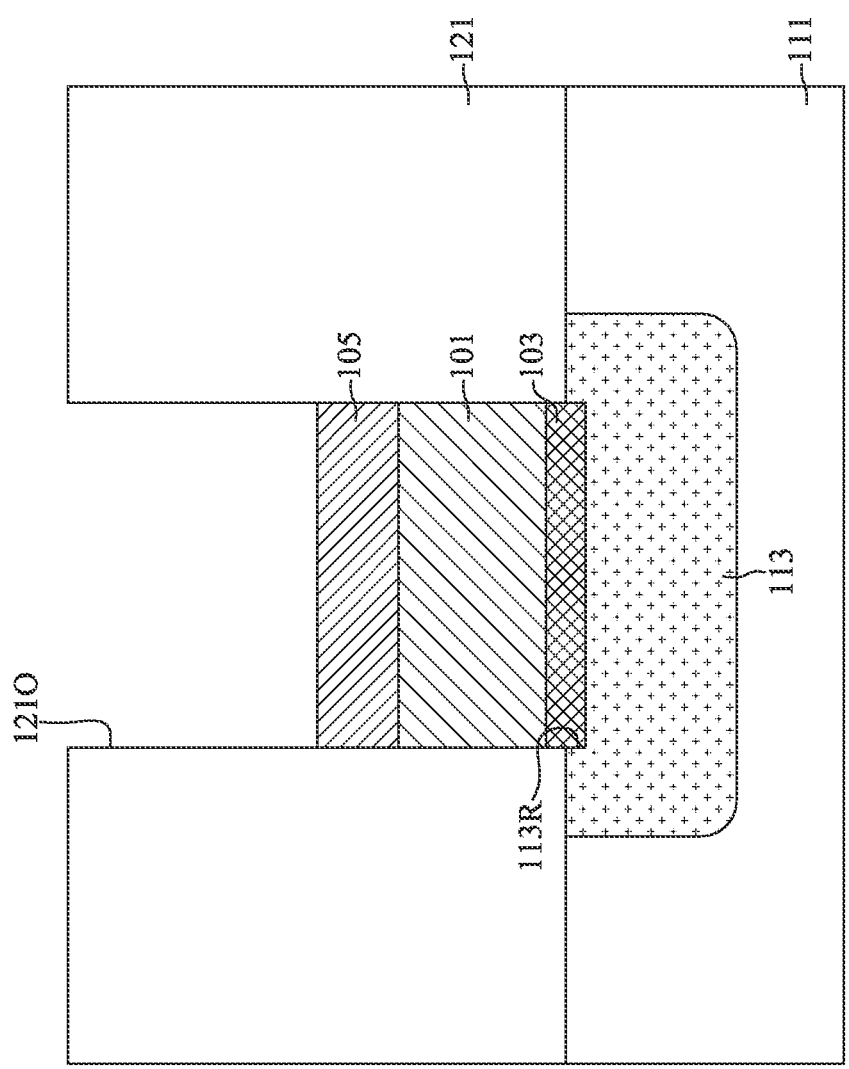

With reference to FIGS. 13 and 17, at step S27, a conductive capping layer 105 may be formed on the bottom conductive layer 101.

With reference to FIG. 17, the conductive capping layer 105 may be formed with a procedure similar to that illustrated in FIGS. 6 to 11, and descriptions thereof are not repeated herein.

With reference to FIG. 13 and FIGS. 18 to 20, at step S29, a top conductive layer 107 may be formed on the conductive capping layer 105 to configure a contact structure 100.

Figure 18:
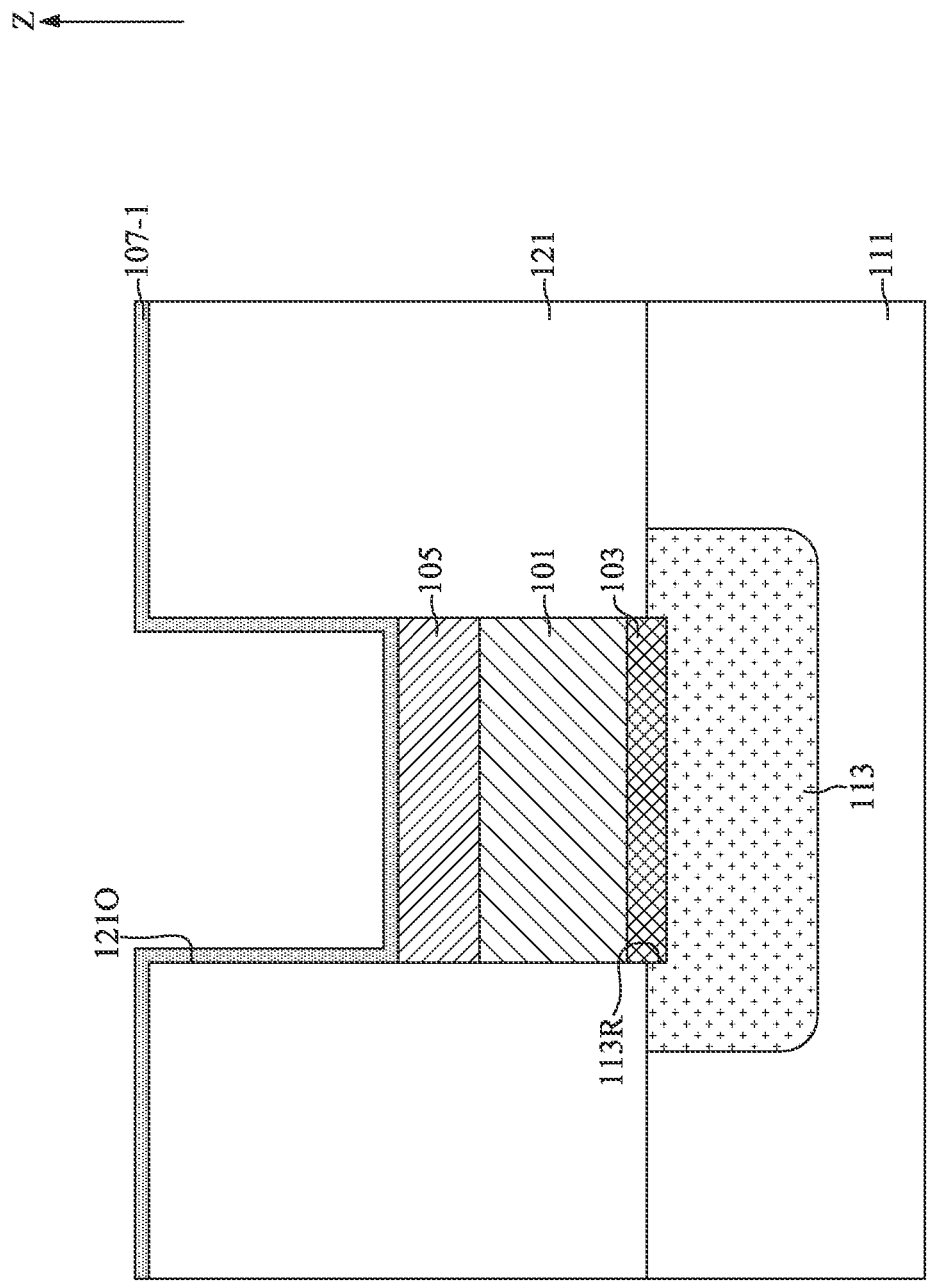

With reference to FIG. 18, a nucleation portion 107-1 may be conformally formed on the conductive capping layer 105, in the contact opening 121O, and on the top surface of the first dielectric layer 121. A bulk portion 107-3 which will be illustrated later may be formed on the nucleation portion 107-1, wherein the nucleation portion 107-1 and the bulk portion 107-3 together configure the top conductive layer 107.

With reference to FIG. 18, the nucleation portion 107-1 and the bulk portion 107-3 may include tungsten. Tungsten may be particularly useful in integrated circuit devices because of its thermal stability during high temperature processes, where processing temperatures may reach 900° C. or more. Additionally, tungsten is a highly refractive material which offers good oxidation resistance and lower resistivity.

In some embodiments, the nucleation portion 107-1 may be a thin conformal layer that serves to facilitate the subsequent formation of a bulk material (i.e., the bulk portion 107-3) thereon. Conforming to the underlying conductive capping layer 105 may be critical to support high quality deposition. In some embodiments, the nucleation portion 107-1 may be formed by a pulsed nucleation layer method.

In the pulsed nucleation layer method, pulses of reactant (e.g., reducing agent or precursor) may be sequentially injected and purged from the reaction chamber, typically by a pulse of a purge gas between reactants. A first reactant may be adsorbed onto the substrate (e.g., the conductive capping layer 105), available to react with the next reactant. The process is repeated in a cyclical fashion until the desired thickness is achieved. It should be noted that, the pulsed nucleation layer method may be generally distinguished from atomic layer deposition by its higher operating pressure range (greater than 1 Torr) and its higher growth rate per cycle (greater than 1 monolayer film growth per cycle). The chamber pressure during the pulsed nucleation layer method may range from about 1 Torr to about 400 Torr.

In some embodiments, the reactants of forming the nucleation portion 107-1 may be, for example, a silicon-containing reducing agent and a tungsten-containing precursor. The conductive capping layer 105 may be initially exposed to the silicon-containing reducing agent and followed by exposure to the tungsten-containing precursor to form the nucleation portion 107-1. The exposure to the silicon-containing reducing agent and the tungsten-containing precursor may be defined as a cycle and may be repeated until the desired thickness of the nucleation portion 107-1 is achieved.

Silane and related compounds have been found to adsorb well to metal nitride surfaces such as titanium nitride and tungsten nitride used as barrier layer materials in some integrated circuit applications. Any suitable silane or silane derivative may be used as the silicon-containing reducing agent, including organic derivatives of silanes. It is generally understood that silanes adsorb on the substrate surface in a self-limiting manner to create nominally a monolayer of silane species. Thus, the amount of adsorbed species is largely independent of the silane dosage.

In some embodiments, the substrate temperature during the exposure to the silicon-containing reducing agent may be between about 200° C. and about 475° C., between about 300° C. and about 400° C., or about 300° C. In some embodiments, the chamber pressure during exposure to the silicon-containing reducing agent may be between about 1 Torr and about 350 Torr or be fixed around 40 Torr. The exposure time (or pulse time) may vary depending in part upon dosages and chamber conditions. In some embodiments, the conductive capping layer 105 is exposed until the surface is sufficiently and evenly covered with at least a saturated layer of silane species. In some embodiments, the silicon-containing reducing agent may be provided alone. In some embodiments, the silicon-containing reducing agent may be provided with a carrier gas such as argon or argon-hydrogen mixtures.

In some embodiments, once the conductive capping layer 105 is sufficiently covered with silane species, the flow of the silicon-containing reducing agent may be stopped. A purge process may be performed to clear residual gas reactants near the surface of the conductive capping layer 105. The purge process may be performed with a carrier gas such as argon, hydrogen, nitrogen, or helium.

In some embodiments, the tungsten-containing precursor may include tungsten hexafluoride, tungsten hexachloride, or tungsten hexacarbonyl. In some embodiments, the tungsten-containing precursor may include organo-metallic compounds that are free of fluorine, such as MDNOW (methylcyclopentadienyl-dicarbonylnitrosyl-tungsten) and EDNOW (ethylcyclopentadienyl-dicarbonylnitrosyl-tungsten). In some embodiments, the tungsten-containing precursor may be provided in a dilution gas, accompanying with gases such as argon, nitrogen, hydrogen, or a combination thereof.

In some embodiments, the substrate temperature during exposure to the tungsten-containing precursor may be between about 200° C. and about 475° C., between about 300° C. and about 400° C., or about 300° C. In some embodiments, the chamber pressure during exposure to the tungsten-containing precursor may be between about 1 Torr and about 350 Torr. Tungsten-containing precursor dosage and substrate exposure time (or pulse time) will vary depending upon many factors. In general, the exposure may be performed until the adsorbed silane species is sufficiently consumed by reaction with the tungsten-containing precursor to produce the nucleation portion 107-1. Thereafter, the flow of the tungsten-containing precursor may be stopped, and a purge process may be performed with a carrier gas such as argon, hydrogen, nitrogen, or helium.

Alternatively, in some embodiments, the reactants of forming the nucleation portion 107-1 may be, for example, a boron-containing reducing agent and the tungsten-containing precursor. The conductive capping layer 105 may be initially exposed to the boron-containing reducing agent and followed by exposure to the tungsten-containing precursor to form the nucleation portion 107-1. The exposure to the boron-containing reducing agent and the tungsten-containing precursor may be defined as a cycle and may be repeated until the desired thickness of the nucleation portion 107-1 is achieved.

In some embodiments, the boron-containing reducing agent may be, for example, borane, diborane, triborane, or boron halides (e.g., $BF_3$, $BCl_3$) with hydrogen. The tungsten-containing precursor may be material similar to the tungsten-containing precursor mentioned above, and descriptions thereof are not repeated herein. In some embodiments, the boron-containing reducing agent may be provided in a dilution gas, accompanying with gases such as argon, nitrogen, hydrogen, silane, or a combination thereof. For example, diborane may be provided from a diluted source (e.g., 5% diborane and 95% nitrogen). In some embodiments, the substrate temperature during exposure to the boron-containing reducing agent may be between about 200° C. and about 475° C., between about 300° C. and about 400° C., or about 300° C. In some embodiments, the chamber pressure during exposure to the boron-containing reducing agent may be between about 1 Torr and about 350 Torr. In some embodiments, once the boron-containing reducing agent is deposited to a sufficient thickness, the flow of boron-containing reducing agent may be stopped. A purge process may be performed with a carrier gas such as argon, hydrogen, nitrogen, or helium.

After exposure to the boron-containing reducing agent, the intermediate semiconductor device may be then exposed to the tungsten-containing precursor. The process is similar to that exposure to the tungsten-containing precursor after exposing to the silicon-containing reducing agent, and descriptions thereof are not repeated herein.

In some embodiments, a pre-treatment may be performed to the conductive capping layer 105 before forming the nucleation portion 107-1 using exposure to the boron-containing reducing agent and the tungsten-containing precursor. The pre-treatment may include diborane.

In some embodiments, exemplary data reveals that the diborane-based nucleation portion 107-1 may produce tungsten with greater grain size in the initial stage of forming the nucleation portion 107-1. In contrast, the silane-based nucleation portion 107-1 may produce tungsten with smaller grain size in the initial stage of forming the nucleation portion 107-1. That is, the deposited bulk portion 107-3 form on the silane-based nucleation portion 107-1 may have less or no defects such as seam and void.

Alternatively, the nucleation portion 107-1 may be formed by being sequentially exposed to the silicon-containing reducing agent, the tungsten-containing precursor, the boron-containing reducing agent, and the tungsten-containing precursor. The four steps of exposure may be defined as a cycle. The entire four-step cycle may be repeated to form the nucleation portion 107-1 with the desired thickness. In a variation of the process, the first two steps of the cycle (sequential exposure to the silicon-containing reducing agent and the tungsten-containing precursor) may be repeated one or more times prior to contact with the boron-containing reducing agent. In another variation, the last two steps of the cycle (sequential exposure to the boron-containing reducing agent and the tungsten-containing precursor) may be repeated one or more times after the first two steps are completed.

Alternatively, in some embodiments, the reactants of forming the nucleation portion 107-1 may be, for example, a germanium-containing reducing agent and the tungsten-containing precursor. The conductive capping layer 105 may be initially exposed to the germanium-containing reducing agent and followed by exposure to the tungsten-containing precursor to form the nucleation portion 107-1. In some embodiments, the germanium-containing reducing agent may be a germane such as $Ge_nH_{n+4}$, $Ge_nH_{n+6}$, $Ge_nH_{n+8}$, and $Ge_nH_m$, where n is an integer from 1 to 10, and n is a different integer than m. Other germanium-containing compounds may also be used, for example, alkyl germanes, alkyl germanium, aminogermanes, carbogermanes, and halogermane. The tungsten-containing precursor may be material similar to the tungsten-containing precursor mentioned above, and descriptions thereof are not repeated herein.

Figure 19:
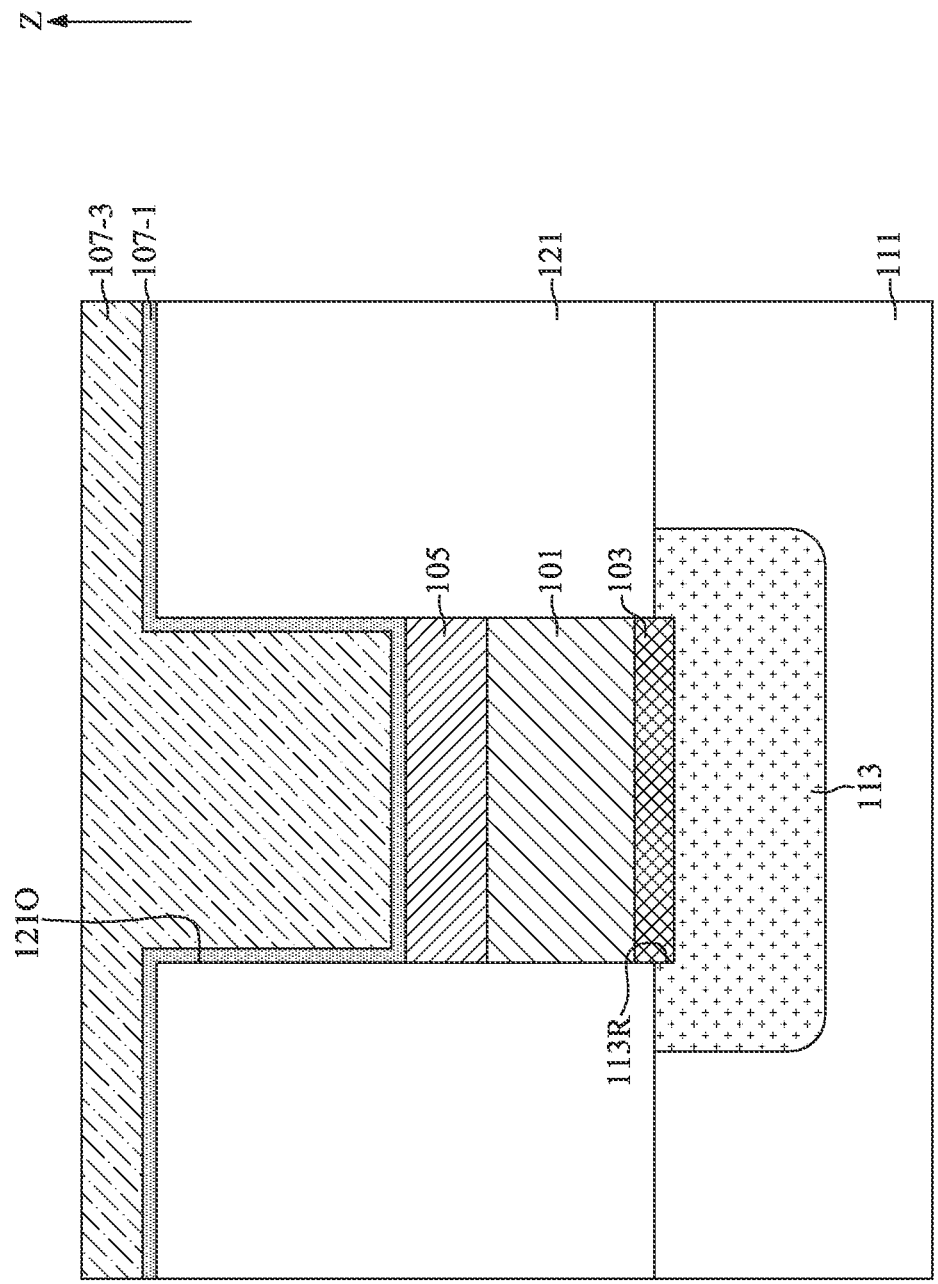

With reference to FIG. 19, the bulk portion 107-3 may be formed on the nucleation portion 107-1 and completely fill the contact opening 121O. The bulk portion 107-3 may be formed by, for example, physical vapor deposition, atomic layer deposition, molecular layer deposition, chemical vapor deposition, in-situ radical assisted deposition, metalorganic chemical vapor deposition, molecular beam epitaxy, sputtering, plating, evaporation, ion beam deposition, electron beam deposition, laser assisted deposition, chemical solution deposition, or any combination thereof.

For example, the deposition of the bulk portion 107-3 using chemical vapor deposition may include flowing (or introducing) a tungsten-containing precursor and a co-reactant such as a reducing agent to the intermediate semiconductor device including the nucleation portion 107-1. Example process pressure may be between about 10 Torr and about 500 Torr. Example substrate temperature may be between about 250° C. and about 495° C. The tungsten-containing precursor may be, for example, tungsten hexafluoride, tungsten chloride, or tungsten hexacarbonyl. The reducing agent may be, for example, hydrogen gas, silane, disilane, hydrazine, diborane, or germane.

In some embodiments, the grain size of tungsten of the bulk portion 107-3 may be greater than 30 nm, than 50 nm, than 70 nm, than 80 nm, than 85 nm, or than 87 nm. In some embodiments, the bulk portion 107-3 may include alpha phase tungsten.

Figure 20:
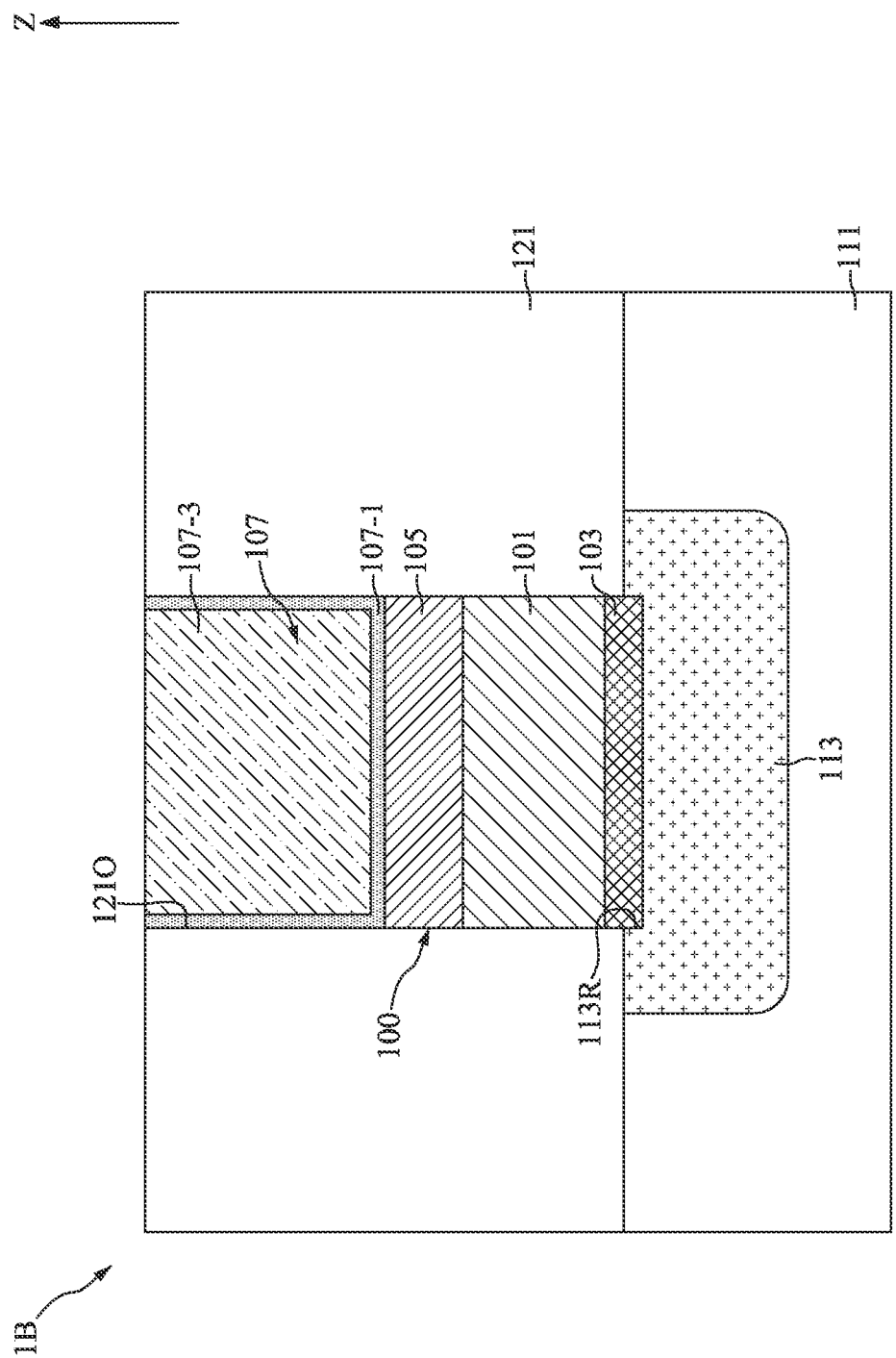

With reference to FIG. 20, a planarization process, such as chemical mechanical polishing, may be performed until the top surface of the first dielectric layer 121 is exposed to remove excess material, provide a substantially flat surface for subsequent processing steps, and concurrently form the top conductive layer 107 in the contact opening 121O and on the conductive capping layer 105.

FIGS. 21 to 24 illustrate, in schematic cross-sectional view diagrams, semiconductor devices 1C, 1D, 1E, 1F in accordance with some embodiments of the present disclosure.

Figure 21:
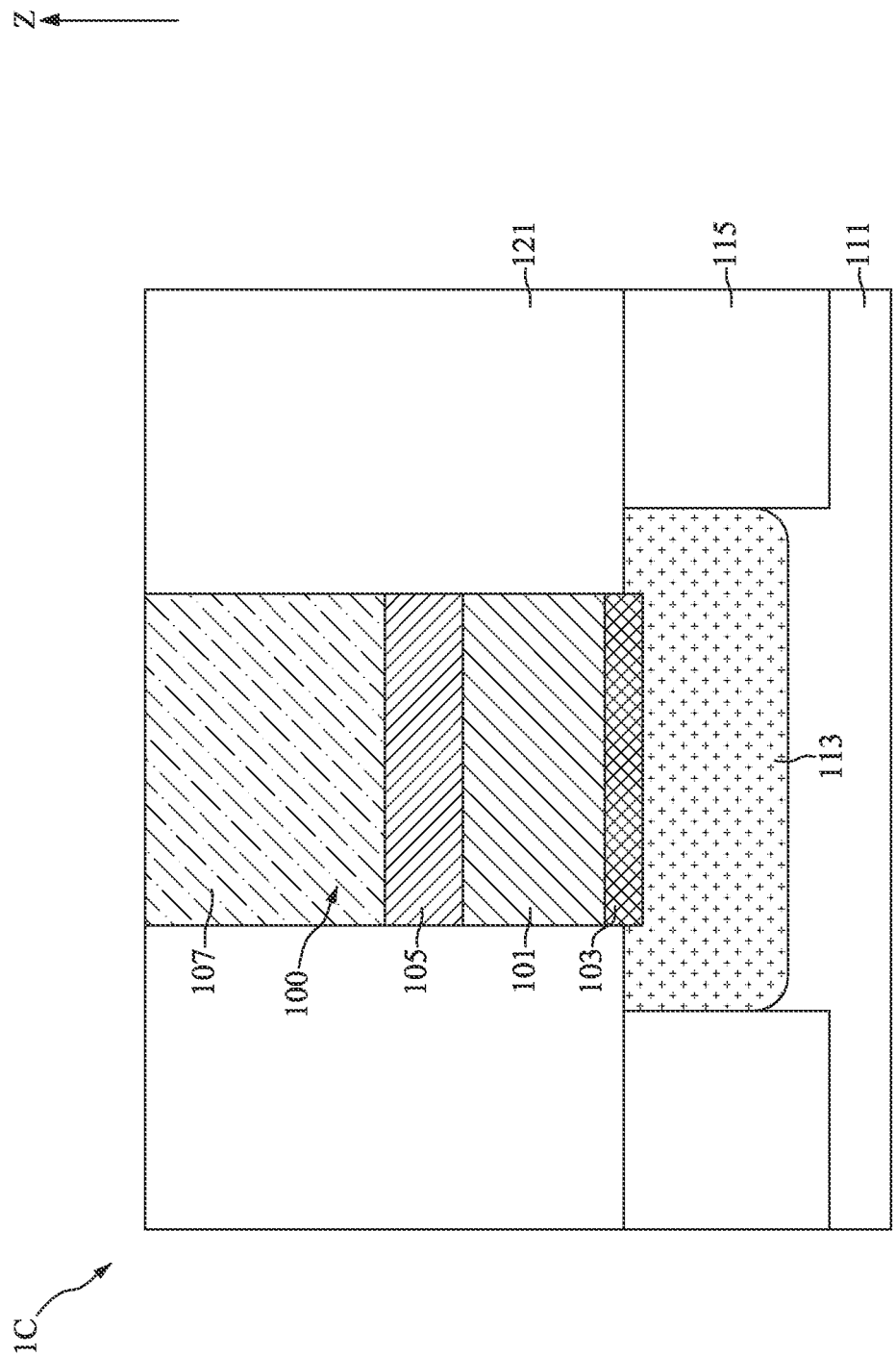
FIGS. 21 to 24 illustrate, in schematic cross-sectional view diagrams, semiconductor devices in accordance with some embodiments of the present disclosure.

With reference to FIG. 21, the semiconductor device 1C may have a structure similar to that illustrated in FIG. 12. The same or similar elements in FIG. 21 as in FIG. 12 have been marked with similar reference numbers and duplicative descriptions have been omitted.

With reference to FIG. 21, the semiconductor device 1C may include an isolation layer 115 disposed in the substrate 111. The isolation layer 115 may define active region(s) of the substrate 111. The impurity region 113 are disposed in the active region of the substrate 111. In some embodiments, the isolation layer 115 may be formed of, for example, silicon oxide, silicon nitride, silicon oxynitride, or silicon nitride oxide.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Figure 22:
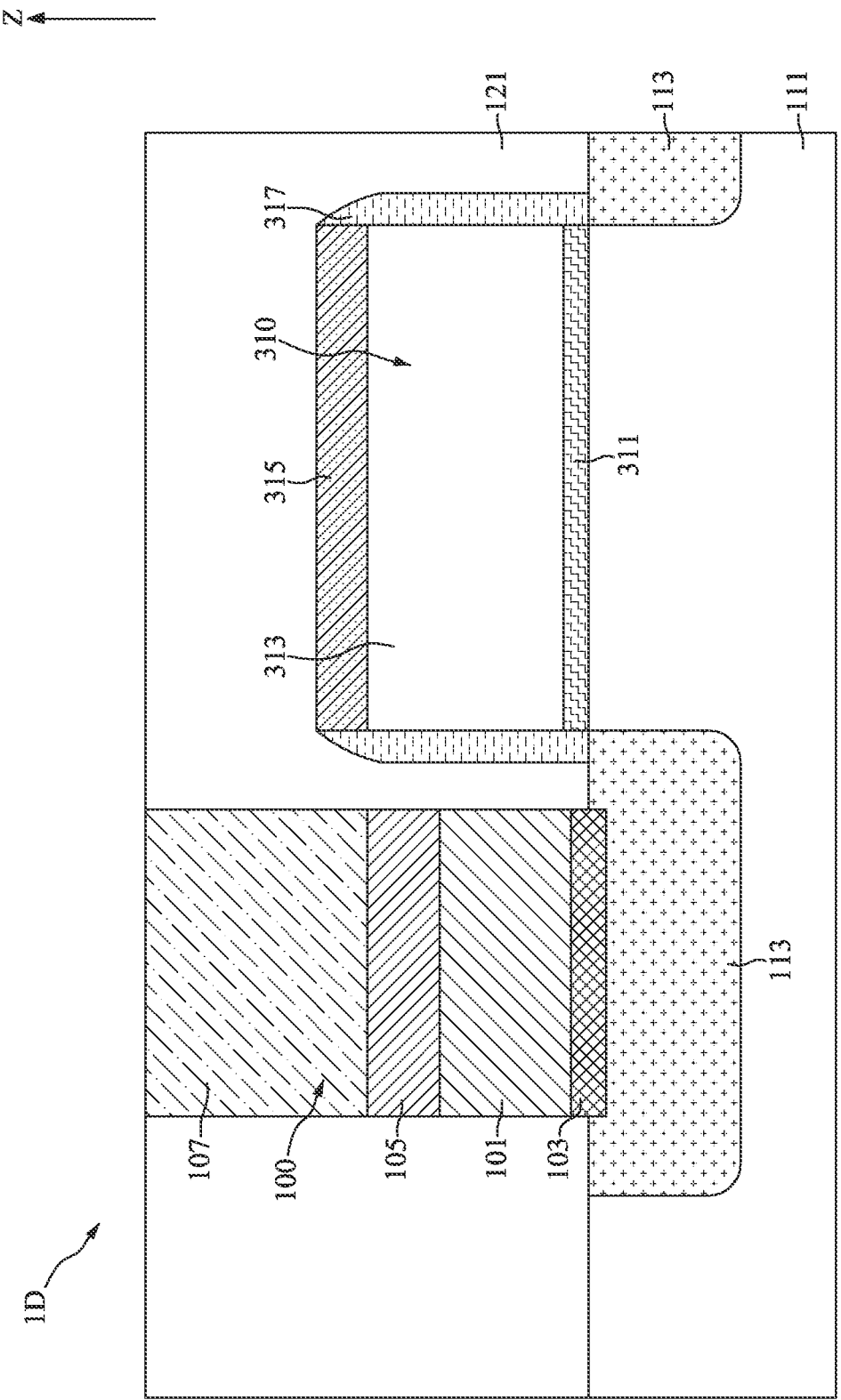

With reference to FIG. 22, the semiconductor device 1D may have a structure similar to that illustrated in FIG. 12. The same or similar elements in FIG. 22 as in FIG. 12 have been marked with similar reference numbers and duplicative descriptions have been omitted.

With reference to FIG. 22, the semiconductor device 1D may include a plurality of impurity regions 113 in the substrate 111 and separated from each other. The semiconductor device 1D may include a first gate structure 310 disposed on the substrate 111, between the plurality of impurity regions 113, and adjacent to the contact structure 100. The first gate structure 310 may include a first gate dielectric layer 311, a first gate conductive layer 313, a first gate capping layer 315, and a plurality of first gate spacers 317.

With reference to FIG. 22, the first gate dielectric layer 311 may be disposed on the substrate 111 and between the plurality of impurity regions 113. In some embodiments, the first gate dielectric layer 311 may be formed of, for example, silicon oxide. In some embodiments, the first gate dielectric layer 311 may be formed of a high-k material such as lanthanum oxide, lanthanum aluminum oxide, zirconium oxide, zirconium silicon oxide, zirconium silicon oxynitride, aluminum oxide or a combination thereof.

With reference to FIG. 22, the first gate conductive layer 313 may be disposed on the first gate dielectric layer 311. In some embodiments, the first gate conductive layer 313 may be formed of for example, doped polycrystalline silicon, doped polycrystalline germanium, doped polycrystalline silicon germanium, or other applicable conductive materials.

With reference to FIG. 22, the first gate capping layer 315 may be disposed on the first gate conductive layer 313. In some embodiments, the first gate capping layer 315 may be formed of for example, silicon oxide, silicon nitride, silicon oxynitride, silicon nitride oxide, or other applicable insulating materials.

With reference to FIG. 22, the plurality of first gate spacers 317 may be disposed on sidewalls of the first gate dielectric layer 311, sidewalls of the first gate conductive layer 313, and sidewalls of the first gate capping layer 315. In some embodiments, the plurality of first gate spacers 317 may be formed of the same material as the first gate capping layer 315 but is not limited thereto. In some embodiments, the plurality of first gate spacers 317 may be formed of, for example, silicon oxide, silicon nitride, silicon oxynitride, silicon nitride oxide, or other applicable insulating materials.

With reference to FIG. 22, the contact structure 100 may have structure similar to that illustrated in FIGS. 2 to 12 or FIGS. 14 to 19, and descriptions thereof are not repeated herein.

Figure 23:
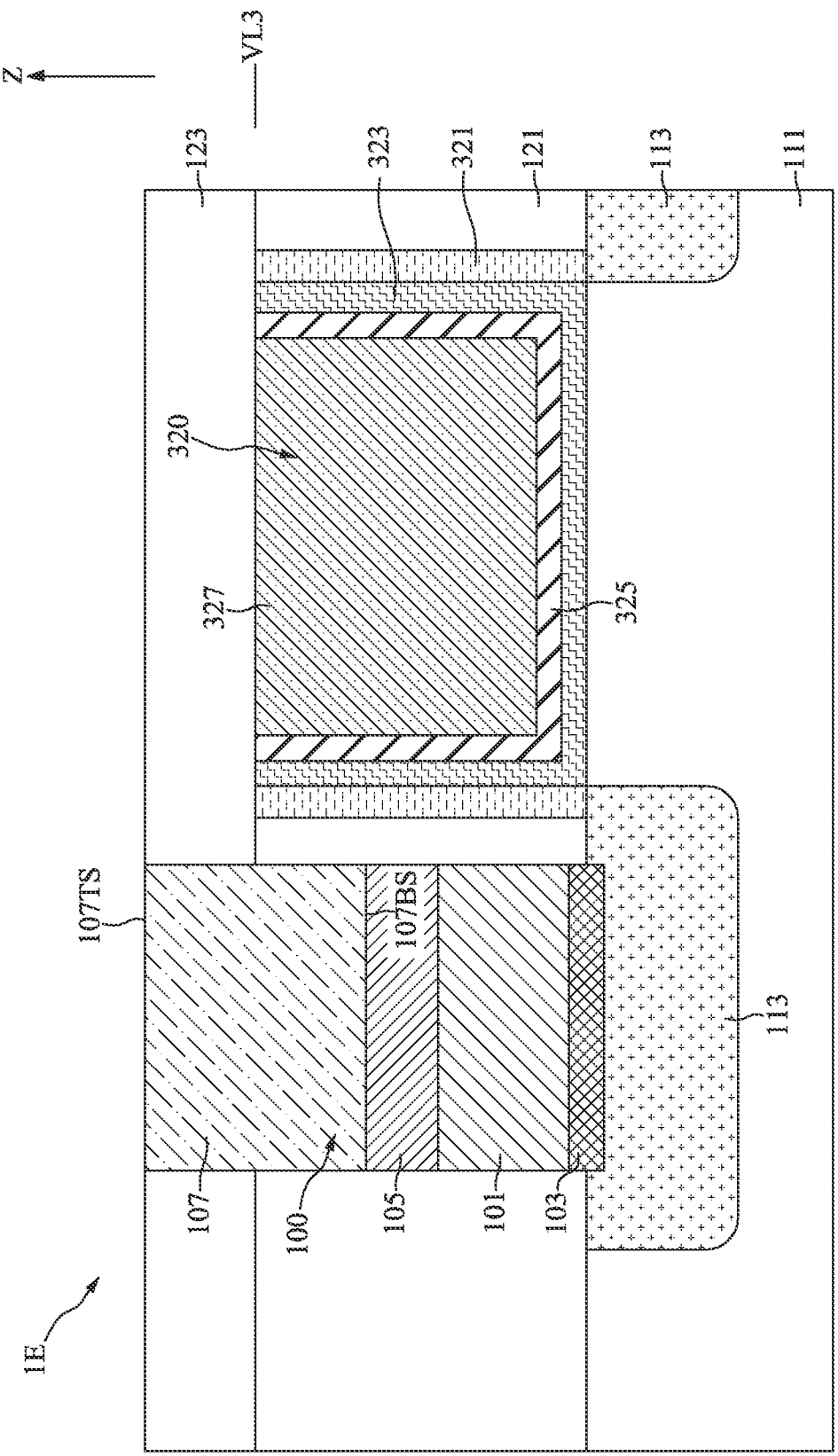

With reference to FIG. 23, the semiconductor device 1E may have a structure similar to that illustrated in FIG. 22. The same or similar elements in FIG. 23 as in FIG. 22 have been marked with similar reference numbers and duplicative descriptions have been omitted.

With reference to FIG. 23, the semiconductor device 1E may include a plurality of impurity regions 113 in the substrate 111 and separated from each other. The semiconductor device 1E may include a second gate structure 320 disposed on the substrate 11, between the plurality of impurity regions 113, and adjacent to the contact structure 100. The second gate structure 320 may include a plurality of second gate insulating layers 321, a second gate dielectric layer 323, a second gate adjustment layer 325, and a second gate conductive layer 327.

With reference to FIG. 23, the second gate dielectric layer 323 may be disposed on the substrate 111 and between the plurality of impurity regions 113. The second gate dielectric layer 323 may have a U-shaped cross-sectional profile. In some embodiments, the second gate dielectric layer 323 may be formed of high-k gate dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, the high-k materials may further include dopants such as, for example, lanthanum and aluminum.

With reference to FIG. 23, the second gate adjustment layer 325 may be conformally disposed on the second gate dielectric layer 323. In some embodiments, the second gate adjustment layer 325 may be formed of, for example, p-type work function materials or n-type work function materials. The p-type work function materials may include compositions such as ruthenium, palladium, platinum, cobalt, nickel, and conductive metal oxides, titanium nitride, or a combination thereof. The n-type work function materials may include compositions such as hafnium, zirconium, titanium, tantalum, aluminum, metal carbides (e.g., hafnium carbide, zirconium carbide, titanium carbide, and aluminum carbide), aluminides, or a combination thereof. The second gate adjustment layer 325 may set the gate characteristics such as threshold voltage (Vt) to a predetermined value.

With reference to FIG. 23, the second gate conductive layer 327 may be disposed on the second gate adjustment layer 325. In some embodiments, the second gate conductive layer 327 may be formed of, for example, aluminum, platinum, gold, silver, tungsten, titanium, cobalt, or a combination thereof.

With reference to FIG. 23, the plurality of second gate insulating layers 321 may be disposed on sidewalls of the second gate dielectric layer 323 to electrically insulate the second gate structure 320 and the contact structure 100. In some embodiments, the plurality of second gate insulating layers 321 may be formed of, for example, silicon oxide or other applicable insulating material.

With reference to FIG. 23, the semiconductor device 1E may include a second dielectric layer 123 disposed on the first dielectric layer 121. In some embodiments, the second dielectric layer 123 may be formed of the same material as the first dielectric layer 121 but is not limited thereto. The second gate structure 320 may be disposed in the first dielectric layer 121. The contact structure 100 may be disposed along the second dielectric layer 123 and the first dielectric layer 121 and extending to the impurity region 113. In some embodiments, the top surface 320TS of the second gate structure 320 may be at a vertical level VL3 between the top surface 107TS of the top conductive layer 107 and the bottom surface 107BS of the top conductive layer 107.

Figure 24:
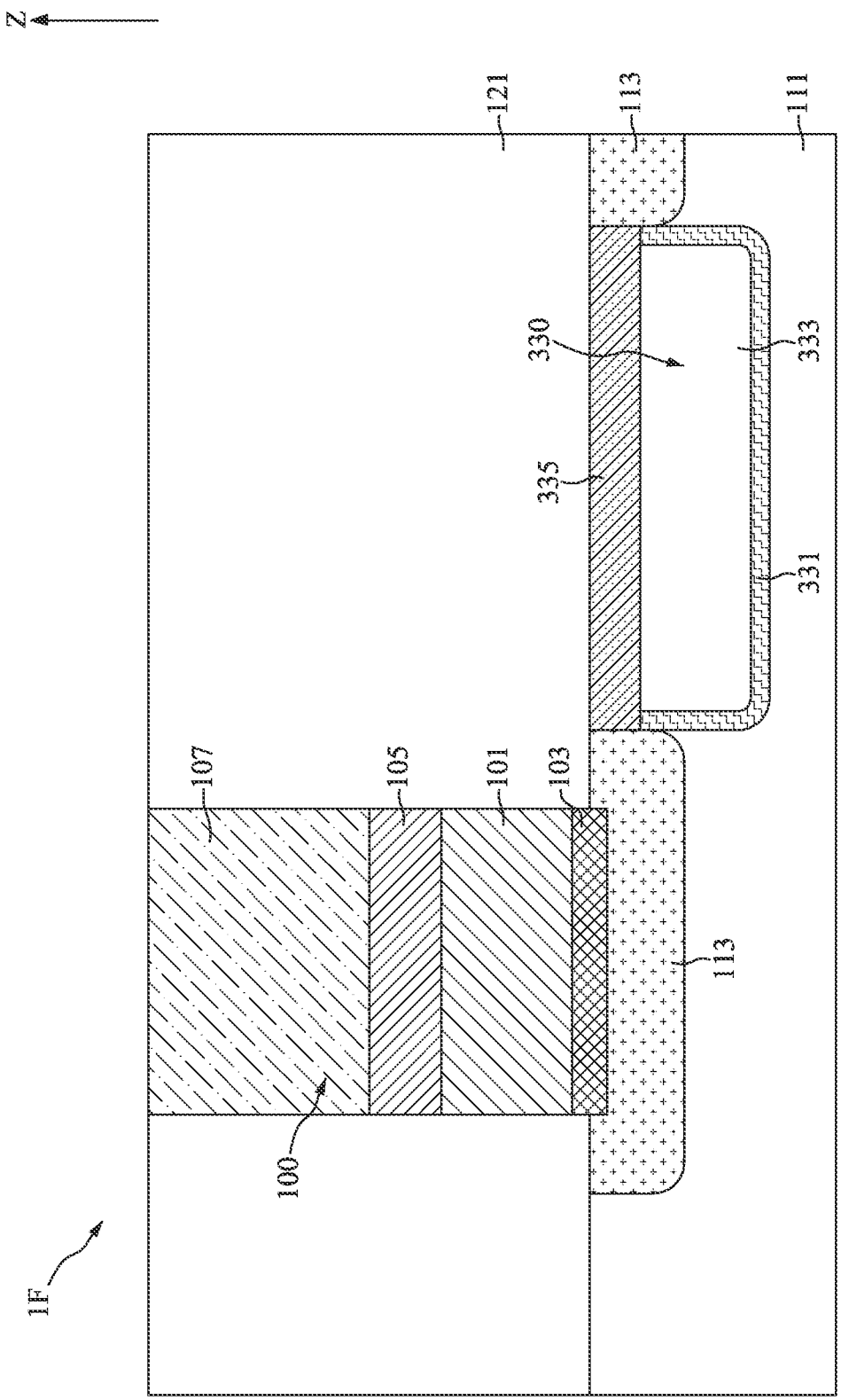

With reference to FIG. 24, the semiconductor device 1F may have a structure similar to that illustrated in FIG. 22. The same or similar elements in FIG. 24 as in FIG. 22 have been marked with similar reference numbers and duplicative descriptions have been omitted.

With reference to FIG. 24, the semiconductor device 1F may include a plurality of impurity regions 113 in the substrate 111 and separated from each other. The semiconductor device 1F may include a third gate structure 330 disposed in the substrate 111 and between the plurality of impurity regions 113. The third gate structure 330 may include a third gate dielectric layer 331, a third gate conductive layer 333, and a third gate capping layer 335.

With reference to FIG. 24, the third gate dielectric layer 331 may be inwardly formed in the substrate 111 and between the plurality of impurity regions 113. The third gate dielectric layer 331 may have a U-shaped cross-sectional profile. In some embodiments, the third gate dielectric layer 331 may be formed of a high-k material, an oxide, a nitride, an oxynitride or combinations thereof. In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof.

With reference to FIG. 24, the third gate conductive layer 333 may be disposed on the third gate dielectric layer 331. In some embodiments, the third gate conductive layer 333 may include a metal, a metal nitride, or a combination thereof. For example, the third gate conductive layer 333 may be formed of titanium nitride, tungsten, or a titanium nitride/tungsten. In some embodiments, the third gate conductive layer 333 may be formed of, for example, a conductive material such as polycrystalline silicon, polycrystalline silicon germanium, or a combination thereof. In some embodiments, the third gate conductive layer 333 may be doped with a dopant such as phosphorus, arsenic, antimony, or boron. In some embodiments, the third gate conductive layer 333 may be formed of, for example, tungsten, aluminum, titanium, copper, the like, or a combination thereof.

With reference to FIG. 24, the third gate capping layer 335 may be disposed on the third gate dielectric layer 331 and the third gate conductive layer 333. The top surface of the third gate capping layer 335 and the top surface of the substrate 111 may be substantially coplanar. In some embodiments, the third gate capping layer 335 may be formed of, for example, silicon oxide, silicon nitride, or other applicable dielectric material.

One aspect of the present disclosure provides a contact structure including an intervening conductive layer; a bottom conductive layer positioned on the intervening conductive layer; a conductive capping layer positioned on the bottom conductive layer; and a top conductive layer positioned on the conductive capping layer. The bottom conductive layer includes germanium or silicon germanium. The bottom conductive layer includes n-type dopants or p-type dopants.

Another aspect of the present disclosure provides a semiconductor device including a substrate; an impurity region positioned in the substrate; an intervening conductive layer positioned on the impurity region; a bottom conductive layer positioned on the bottom conductive layer; a conductive capping layer positioned on the bottom conductive layer; a top conductive layer positioned on the conductive capping layer. The intervening conductive layer, the bottom conductive layer, the conductive capping layer, and the top conductive layer configure a contact structure. The bottom conductive layer includes germanium or silicon germanium. The bottom conductive layer includes n-type dopants or p-type dopants.

Another aspect of the present disclosure provides a method for fabricating a semiconductor device including providing a substrate; forming an impurity region in the substrate; forming a bottom conductive layer on the impurity region; performing an implantation process using p-type dopants or n-type dopants to the bottom conductive layer; performing an annealing process to form an intervening conductive layer between the impurity region and the bottom conductive layer; forming a conductive capping layer on the bottom conductive layer; and forming a top conductive layer on the conductive capping layer. The intervening conductive layer, the bottom conductive layer, the conductive capping layer, and the top conductive layer configure a contact structure. The bottom conductive layer includes germanium or silicon germanium.

Due to the design of the semiconductor device of the present disclosure, the resistance of the contact structure 100 may be reduced by employing the bottom conductive layer 101 formed of germanium. As a result, the performance of the semiconductor device 1A including the contact structure 100 may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A contact structure, comprising:
   an intervening conductive layer;
   a bottom conductive layer positioned on the intervening conductive layer;
   a conductive capping layer positioned on the bottom conductive layer; and
   a top conductive layer positioned on the conductive capping layer;
   wherein the bottom conductive layer comprises germanium or silicon germanium, and the intervening conductive layer comprises silicon germanium;
   wherein the bottom conductive layer comprises n-type dopants or p-type dopants.

2. The contact structure of claim 1, wherein the top conductive layer comprises a metal and the conductive capping layer comprises a metal nitride derivatized from the metal of the top conductive layer; the p-type dopants comprise boron, aluminum, gallium, or indium; and the n-type dopants comprise antimony, arsenic, or phosphorus.

3. The semiconductor device of claim 2, wherein a thickness ratio of a thickness of the intervening conductive layer to a thickness of the bottom conductive layer is between about 0.01 and about 0.15, the top conductive layer comprises tungsten and the conductive capping layer comprises tungsten nitride.

4. A semiconductor device, comprising:
   a substrate;
   an impurity region positioned in the substrate;
   an intervening conductive layer positioned on the impurity region;
   a bottom conductive layer positioned on the bottom conductive layer;
   a conductive capping layer positioned on the bottom conductive layer;
   a top conductive layer positioned on the conductive capping layer;
   wherein the intervening conductive layer, the bottom conductive layer, the conductive capping layer, and the top conductive layer configure a contact structure;
   wherein the bottom conductive layer comprises germanium or silicon germanium, and the intervening conductive layer comprises silicon germanium;
   wherein the bottom conductive layer comprises n-type dopants or p-type dopants.

5. The semiconductor device of claim 4, wherein the top conductive layer comprises a metal and the conductive capping layer comprises a metal nitride derivatized from the metal of the top conductive layer; the p-type dopants comprise boron, aluminum, gallium, or indium; and the n-type dopants comprise antimony, arsenic, or phosphorus.

6. The semiconductor device of claim 5, wherein a bottom surface of the intervening conductive layer is at a vertical level lower than a top surface of the impurity region.

7. The semiconductor device of claim 5, wherein a top surface of the intervening conductive layer is at a vertical level higher than the top surface of the impurity region.

8. The semiconductor device of claim 5, wherein a thickness ratio of a thickness of the intervening conductive layer to a thickness of the bottom conductive layer is between about 0.01 and about 0.15; the top conductive layer comprises tungsten and the conductive capping layer comprises tungsten nitride.

9. The semiconductor device of claim 8, wherein the impurity region comprises n-type dopants or p-type dopants.

10. The semiconductor device of claim 9, wherein the impurity region comprises silicon and/or germanium with substantially no oxygen and nitrogen.

11. The semiconductor device of claim 9, further comprising an isolation layer positioned in the substrate and surrounding the impurity region.

12. The semiconductor device of claim 9, further comprising a first gate structure comprising:
a first gate dielectric layer positioned on the substrate and next to the contact structure;
a first gate conductive layer positioned on the first gate dielectric layer; and
a first gate capping layer positioned on the first gate conductive layer.

13. The semiconductor device of claim 9, further comprising a second gate structure and comprising:
a second gate dielectric layer positioned on the substrate, next to the contact structure, and comprising a U-shaped cross-sectional profile;
a second gate adjustment layer conformally positioned on the second gate dielectric layer; and
a second gate conductive layer positioned on the second gate adjustment layer.

14. A method for fabricating a semiconductor device, comprising:
providing a substrate;
forming an impurity region in the substrate;
forming a bottom conductive layer on the impurity region;
performing an implantation process using p-type dopants or n-type dopants to the bottom conductive layer;
performing an annealing process to form an intervening conductive layer between the impurity region and the bottom conductive layer;
forming a conductive capping layer on the bottom conductive layer; and
forming a top conductive layer on the conductive capping layer;
wherein the intervening conductive layer, the bottom conductive layer, the conductive capping layer, and the top conductive layer configure a contact structure;
wherein the bottom conductive layer comprises germanium or silicon germanium, and the intervening conductive layer comprises silicon germanium.

15. The method for fabricating the semiconductor device of claim 14, wherein the top conductive layer comprises a metal and the conductive capping layer comprises a metal nitride derivatized from the metal of the top conductive layer; the p-type dopants comprise boron, aluminum, gallium, or indium; and the n-type dopants comprise antimony, arsenic, or phosphorus.

16. The method for fabricating the semiconductor device of claim 15, wherein the top conductive layer comprises tungsten and the conductive capping layer comprises tungsten nitride.

17. The method for fabricating the semiconductor device of claim 16, wherein a process temperature of the annealing process is between about 800° C. and about 1250° C.

18. The method for fabricating the semiconductor device of claim 17, where a process duration of the annealing process is between about 1 millisecond and about 500 milliseconds.

19. The method for fabricating the semiconductor device of claim 18, wherein the impurity region comprises silicon and/or germanium with substantially no oxygen and nitrogen.

* * * * *